United States Patent
Gopal et al.

(10) Patent No.: US 9,690,488 B2
(45) Date of Patent: Jun. 27, 2017

(54) DATA COMPRESSION USING ACCELERATOR WITH MULTIPLE SEARCH ENGINES

(71) Applicant: Intel Corporation, Santa Clara, CA (US)

(72) Inventors: Vinodh Gopal, Westborough, MA (US); James D. Guilford, Northborough, MA (US); Gilbert M. Wolrich, Framingham, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 14/886,348

(22) Filed: Oct. 19, 2015

(65) Prior Publication Data
US 2017/0109056 A1    Apr. 20, 2017

(51) Int. Cl.
*G06F 12/00* (2006.01)
*G06F 3/06* (2006.01)
(Continued)

(52) U.S. Cl.
CPC ............ *G06F 3/0608* (2013.01); *G06F 3/064* (2013.01); *G06F 3/0656* (2013.01); *G06F 3/0661* (2013.01); *G06F 3/0685* (2013.01); *G06F 12/0292* (2013.01); *G06F 12/0638* (2013.01); *G06F 12/0684* (2013.01); *G06F 12/0868* (2013.01); *G06F 12/1018* (2013.01)

(58) Field of Classification Search
CPC ...... G06F 3/0608; G06F 3/064; G06F 3/0656; G06F 3/0661; G06F 3/0685; G06F 12/0292; G06F 12/0638; G06F 12/0684; G06F 12/0868; G06F 12/1018

USPC ........ 711/154, 156; 707/693, 698, 715, 747, 707/781, 830; 710/20, 26, 33, 36, 107, 710/120; 712/14, 27, 36, 225, 245
See application file for complete search history.

(56) References Cited

U.S. PATENT DOCUMENTS 6,278,992 B1 *  8/2001  Curtis ............... G06F 17/30324
                                                          707/711
6,320,523 B1 * 11/2001  York ................... H03M 7/3088
                                                          341/106

(Continued)

OTHER PUBLICATIONS

PCT Search Report issued in corresponding PCT application No. PCT/US2016/052758 dated Dec. 19, 2016, (13 pages).

*Primary Examiner* — Reba I Elmore
(74) *Attorney, Agent, or Firm* — Trop, Pruner & Hu, P.C.

(57) ABSTRACT

In an embodiment, a processor includes hardware processing cores, a cache memory, and a compression accelerator comprising a hash table memory. The compression accelerator is to: determine a hash value for input data to be compressed; read a first plurality of N location values stored in a hash table entry indexed by the hash value; perform a first set of string searches in parallel from a history buffer using the first plurality of N location values stored in the hash table entry; read a second plurality of N location values stored in a first overflow table entry indexed by a first overflow pointer included in the hash table entry; and perform a second set of string searches in parallel from the history buffer using the second plurality of N location values stored in the first overflow table entry. Other embodiments are described and claimed.

20 Claims, 22 Drawing Sheets

(51) Int. Cl.
  *G06F 12/02* (2006.01)
  *G06F 12/0868* (2016.01)
  *G06F 12/06* (2006.01)
  *G06F 12/1018* (2016.01)

(56) References Cited

U.S. PATENT DOCUMENTS

| | | | |
|---|---|---|---|
| 8,738,860 B1* | 5/2014 | Griffin | G06F 12/0897 |
| | | | 711/122 |
| 2004/0160983 A1* | 8/2004 | Kuskin | H04W 28/06 |
| | | | 370/471 |
| 2006/0265370 A1 | 11/2006 | Qian | |
| 2010/0228947 A1* | 9/2010 | Sasao | G06F 17/30949 |
| | | | 711/216 |
| 2011/0004639 A1 | 1/2011 | Williams | |
| 2011/0289279 A1* | 11/2011 | Sonnier | G06F 12/0804 |
| | | | 711/144 |
| 2012/0257626 A1 | 10/2012 | McGhee et al. | |
| 2012/0265766 A1 | 10/2012 | Benhase et al. | |
| 2015/0301975 A1* | 10/2015 | Garg | G06F 13/4221 |
| | | | 710/105 |
| 2016/0188656 A1* | 6/2016 | Ekanadham | G06F 9/547 |
| | | | 707/755 |
| 2016/0239445 A1* | 8/2016 | Davis | G06F 13/364 |
| 2016/0285473 A1* | 9/2016 | Kim | H03M 7/6029 |

* cited by examiner

DATA COMPRESSION USING ACCELERATOR WITH MULTIPLE SEARCH ENGINES

FIELD OF INVENTION

Embodiments relate generally to data compression. More particularly, embodiments are related to data compression using an accelerator with multiple search engines.

BACKGROUND

Advances in computing and networking have been associated with the use of compression technologies to reduce the size of data. For example, internet services may utilize compression techniques to decrease the bandwidth required for network traffic. Further, computing devices may utilize compression to reduce the amount of storage space required to store data.

DETAILED DESCRIPTION

Figure 1A:
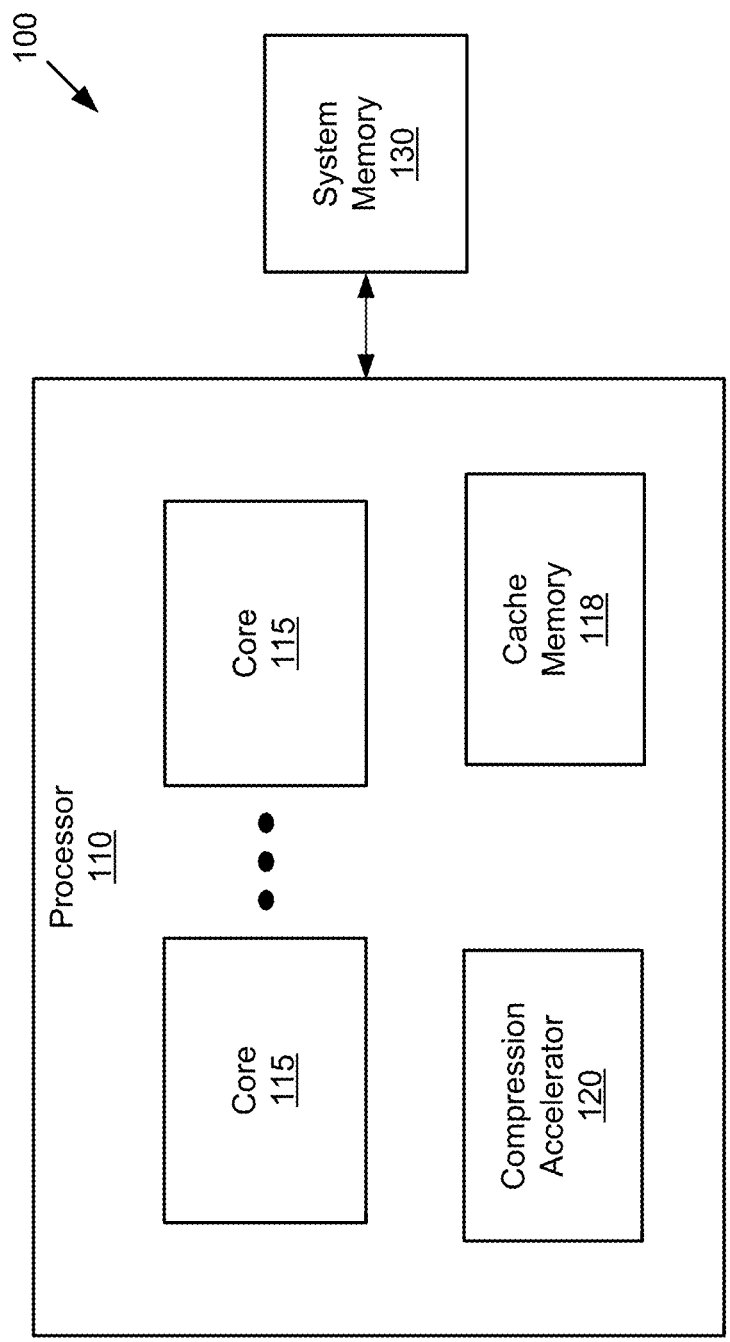
FIG. 1A is a block diagram of a system in accordance with one or more embodiments.

Some lossless data compression algorithms incorporate Lempel-Ziv ("LZ") algorithms such as LZ77. For example, the DEFLATE compression algorithm uses a combination of the LZ77 algorithm and Huffman coding. The LZ77 algorithm performs duplicate string elimination by replacing a string with a reference to an earlier instance of the same string within a data stream. The reference is encoded by a length-distance (L, D) pair. To identify matches to earlier strings, LZ77 uses a sliding window of the most recent portion of the data stream. In the DEFLATE algorithm, the LZ77 duplicate string elimination operation is followed by an encoding operation using a Huffman coding technique. In Huffman coding, symbols are encoded using a variable-length code table based on entropy, such that more common symbols are generally represented using fewer bits than less common symbols. Some LZ77 operations may use linked lists to identify earlier strings to be compared to a current string. For example, a linked list may enable a chain of memory locations to be read in sequence to identify matching strings. However, the sequential reading of chained locations may limit the speed of performing the LZ77 operation.

In accordance with some embodiments, a hardware compression accelerator may include multiple comparators or search engines to compare earlier strings to be a current string. The compression accelerator uses hybrid memory data structures that may be split between internal memory and external memory. In some embodiments, the compression accelerator can process the strings in parallel fashion using table entries that may include multiple location values and/or entry pointers. Accordingly, some embodiments may reduce the latency time to access strings. Further, some embodiments may enable flexibility and efficiency to use the memory structures in the compression accelerator.

Although the following embodiments are described with reference to particular implementations, embodiments are not limited in this regard. In particular, it is contemplated that similar techniques and teachings of embodiments described herein may be applied to other types of circuits, semiconductor devices, processors, systems, etc. For example, the disclosed embodiments may be implemented in any type of computer system, including server computers (e.g., tower, rack, blade, micro-server and so forth), communications systems, storage systems, desktop computers of any configuration, laptop, notebook, and tablet computers (including 2:1 tablets, phablets and so forth).

In addition, disclosed embodiments can also be used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. Further, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth.

Referring now to FIG. 1A, shown is a block diagram of a system 100 in accordance with one or more embodiments. In some embodiments, the system 100 may be all or a portion of an electronic device or component. For example, the system 100 may be a cellular telephone, a computer, a server, a network device, a system on a chip (SoC), a controller, a wireless transceiver, a power supply unit, etc. Furthermore, in some embodiments, the system 100 may be any grouping of related or interconnected devices, such as a datacenter, a computing cluster, etc.

As shown in FIG. 1A, the system 100 may include a processor 110 and system memory 130. Further, although not shown in FIG. 1A, the system 100 may include other components. The processor 110 may be a general purpose hardware processor (e.g., a central processing unit (CPU)). As shown, the processor 110 can include any number of processing cores 115, a compression accelerator 120, and cache memory 118. Each core 115 may be a general purpose processing core. The system memory 130 and the cache memory 118 can be implemented with any type(s) of computer memory (e.g., dynamic random access memory (DRAM), static random-access memory (SRAM), non-volatile memory (NVM), a combination of DRAM and NVM, etc.). The cache memory 118 may include a processor-level cache, a core-level cache, a shared cache, and/or any combination thereof.

In one or more embodiments, the compression accelerator 120 may be a hardware unit dedicated to performing compression operations. For example, the compression accelerator 120 may be any hardware unit such as a compression co-processor, a plug-in card, a module, a chip, a processing block, etc. The compression accelerator 120 may receive input data, and may perform operations to compress the input data. For example, in some embodiments, the compression accelerator 120 may perform compression operations based on the LZ77 algorithm, and may use length-distance pairs to encode duplicated strings within the input data. Further, in some embodiments, the compression accelerator 120 may use other compression algorithms. For example, the compression accelerator 120 may use a DEFLATE algorithm, a Lempel-Ziv-Oberhumer (LZO) algorithm, a Lempel-Ziv-Stac (LZS) algorithm, a LZ4 algorithm, a LZF algorithm, and so forth.

Figure 1B:
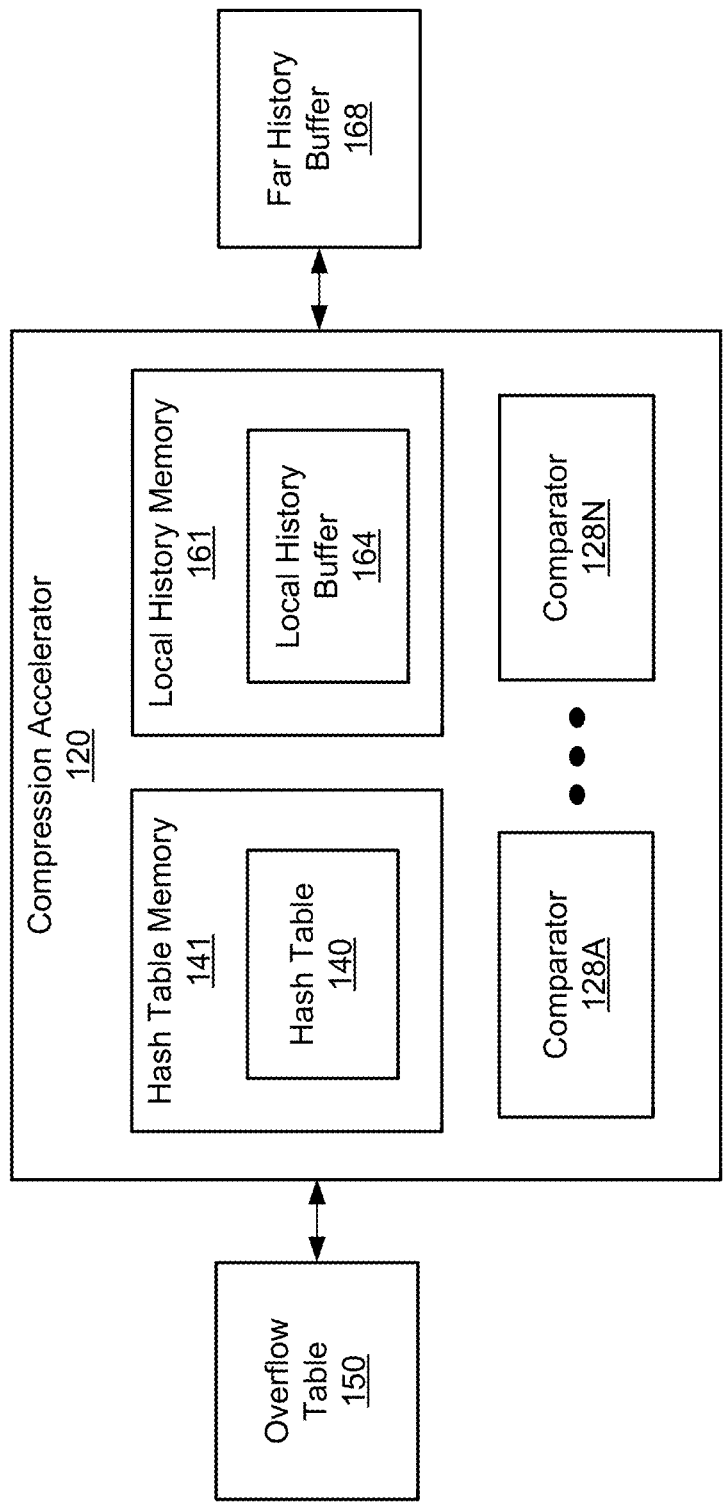
FIG. 1B is a block diagram of a system in accordance with one or more embodiments.

Referring now to FIG. 1B, shown is a block diagram of the compression accelerator 120 in accordance with one or more embodiments. As shown, the compression accelerator 120 may include a hash table memory 141, a local history memory 161, and any number N of comparators 128A-128N (referred to collectively as "comparators 128"). Further, in some embodiments, the compression accelerator 120 may be coupled to an overflow table 150 and a far history buffer 168.

In some embodiments, the hash table memory 141 and the local history memory 161 are specialized memory units included in the compression accelerator 120. For example, the hash table memory 141 and the local history memory 161 may include DRAM, SRAM, NVM, and so forth. The local history memory 161 is dedicated for storing a local history buffer 164. In some embodiments, the local history buffer 164 stores a fixed number of the most recent characters processed by the compression accelerator 120 (referred to as the "sliding window"). For example, in one embodiment, the local history buffer 164 stores a sliding window with a capacity of 16 KB.

In some embodiments, the characters that expire from sliding window of the local history buffer 164 can be stored in the far history buffer 168. In some embodiments, the far history buffer 168 may be stored externally to the compression accelerator 120. For example, the far history buffer 168 may be stored in the cache memory 118 or the system memory 130 (shown in FIG. 1A), in a combination of the cache memory 118 and the system memory 130, or in any other storage location of the system 100. The local history buffer 164 and the far history buffer 168 may be referred to collectively as the "history buffer."

The hash table memory 141 may be dedicated for storing a hash table 140. The hash table 140 can include any number of entries (referred to herein as "hash entries") that are indexed according to hash values. In some embodiments, each hash entry of the hash table 140 corresponds to a unique hash value of an input data portion (e.g., a string of three bytes). Each hash entry can include a set of N location fields and a pointer field. Each of the N location fields can store a location value indicating the history buffer location of a previously-processed string associated with the hash value of that hash entry. For example, in one embodiment, the hash table 140 can include 32 KB of hash entries, with each hash entry including four location fields. In some embodiments, any hash entries of the hash table 140 that become full are moved to the overflow table 150. An example of moving hash entries to the overflow table 150 is described below with reference to FIG. 1C.

In some embodiments, each of the comparators 128A-128N may be an execution unit including circuitry/logic to search for matching strings in the history buffer. For example, in some embodiments, the comparators 128A-128N can each perform a search operation by comparing input data to a sequence of characters read from the history buffer. The data read from the history buffer may be accessed using the location fields of the hash table 140 and/or the overflow table 150. In some embodiments, the comparators 128A-128N can each access a different location in the history buffer. Accordingly, the comparators 128A-128N can perform N search operations in parallel.

Figure 1C:
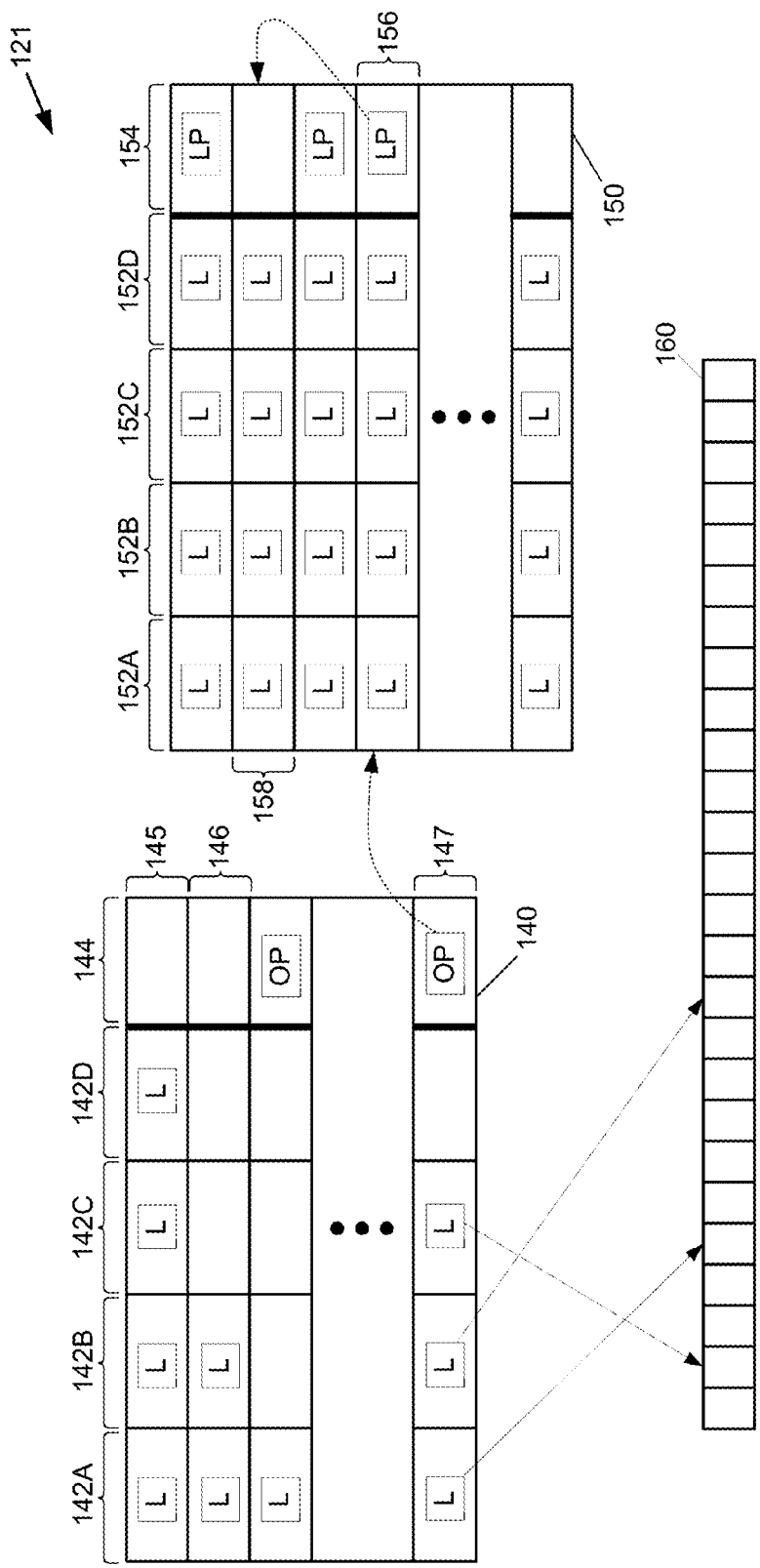
FIG. 1C is a block diagram of example data structures in accordance with one or more embodiments.

Referring now to FIG. 1C, shown is a block diagram of example data structures 121 in accordance with one or more embodiments. Specifically, FIG. 1C shows examples of a hash table 140, an overflow table 150, and a history buffer 160. The history buffer 160 may correspond to the local history buffer 164, the far history buffer 168, or a combination thereof. Note that the data structures 121 shown in FIG. 1C are provided for the sake of example, and are not intended to limit any embodiments.

As shown in FIG. 1C, the hash table 140 includes multiple rows, with each row representing a hash entry. In this example, each hash entry of the hash table 140 is shown to include four location fields 142A-142D (referred to collectively as location fields 142) and an overflow pointer field 144. Each hash entry is indexed to a unique hash value of an input data portion (e.g., a string of characters in a data stream). The process of updating the hash table 140 may be referred to as a "hash update" operation. Further, the process of reading the hash table 140 may be referred to as a "hash look-up" operation.

As shown in FIG. 1C, the overflow table 150 includes multiple rows, with each row representing an overflow entry. In this example, each overflow entry of the overflow table 150 is shown to include four location fields 152A-152D (referred to collectively as overflow fields 152) and a link pointer field 154. Further, the history buffer 160 includes a number of storage locations to store input data (e.g., a sliding window of characters). In some embodiments, the hash entries of the hash table 140 and/or the overflow entries of the overflow table 150 may be sized to match the cache lines in cache memory 118 (shown in FIG. 1A).

Assume that FIG. 1C shows a state of the data structures during a compression operation. Assume further that, at the time of initiating and/or resetting the compression operation, the data structures 121 did not include any values (not shown).

In some embodiments, during a compression operation, each string that is processed is stored in an initial location of the history buffer 160 (i.e., at the start of the sliding window). Further, the hash value of the string is determined, and the location of that string in the history buffer 160 is stored in a location field 142 of the hash entry indexed to the hash value of the string. This process can be repeated until all four location fields 142 in a hash entry are filled with respective location values. For example, assume that the string associated with hash entry 146 has occurred two times during the compression operation, and the string associated with hash entry 145 has occurred four times during the compression operation. Accordingly, as shown in FIG. 1C, the first two location fields 142A-142B of hash entry 146 each include location values (represented by the letter "L") identifying different locations in the history buffer 160, but the remaining location fields 142C-142D and the overflow pointer field 144 of hash entry 146 remain empty. Further, as shown, the four location fields 142A-142C of hash entry 145 each include location values.

In some embodiments, in the event that all location fields 142 in a hash entry are already filled, the values stored in that hash entry are moved or "spilled" to a new entry of the overflow table 150. For example, referring to hash entry 145, if a new string with the same hash is encountered, a new overflow entry may be created in the overflow table 150, and the contents of the hash entry (e.g., the values stored in location fields 142A-142D and overflow pointer field 144) may be copied to the new overflow entry. The contents of the hash entry may be deleted, and thus the fields of the hash entry may be cleared to store new data. Further, the overflow pointer field 144 of the hash entry may be populated with a pointer to the new overflow entry. In this manner, the overflow pointer field 144 may define a link from the hash entry to the new overflow entry. For example, referring to FIG. 1C, the overflow pointer field 144 of hash entry 147 is shown to include an overflow pointer (represented by the letters "OP") to overflow entry 156, thereby indicating that the four location fields 142A-142D of hash entry 147 were previously filled, and the contents of location fields 142A-142D of hash entry 147 were then spilled to overflow entry 156.

In some embodiments, the overflow table 150 may include multiple overflow entries that are linked in a chain to a hash entry. For example, referring to FIG. 1C, assume that hash entry 147 has spilled two times. Accordingly, the overflow entry 156 is shown to include a link pointer (represented by the letters "LP") to overflow entry 158, thereby indicating that hash entry 147 first spilled to overflow entry 158, and later spilled to overflow entry 156. In this manner, the link pointer field 154 may be used to link a chain of any number of overflow entries. Note that the link pointer field 154 of overflow entry 158 is empty, thus indicating that overflow entry 158 was created in the first instance that hash entry 147 spilled.

In some embodiments, a hash entry of hash table 140 may be only be moved or spilled to the overflow table 150 when all location fields 142 of that hash entry are filled. Accordingly, in some embodiments, all of the location fields 152 in each overflow entry of the overflow table 150 are full during operation.

In some embodiments, the overflow table 150 may be stored externally to the compression accelerator 120. For example, referring to FIG. 1A, the overflow table 150 may be stored in the cache memory 118, the system memory 130, a combination of the cache memory 118 and the system memory 130, or any other storage location of the system 100. In some embodiments, the overflow table 150 is not indexed according to location, but rather is indexed by pointers from the hash table 140. Thus, in such embodiments, the overflow table 150 may include any number of entries without regard to the number of locations in a history data structure.

In some embodiments, each comparator 128 (shown in FIG. 1B) uses a unique location field to read data from the history buffer 160. Stated differently, the number N of comparators 128 in the compression accelerator 120 can be equal to the number of location fields in the hash table 140. For example, referring to FIGS. 1B-1C, assume that the compression accelerator 120 includes four comparators 128, with each comparator 128 using a different one of location fields 142A-142D to access the history buffer 160. Thus, in this example, the four comparators 128 of the compression accelerator 120 can perform four parallel search operations for each hash entry or overflow entry that is read. Accordingly, in some embodiments, the read wait times of each comparator 128 may be reduced by accessing N locations in parallel.

Figure 1D:
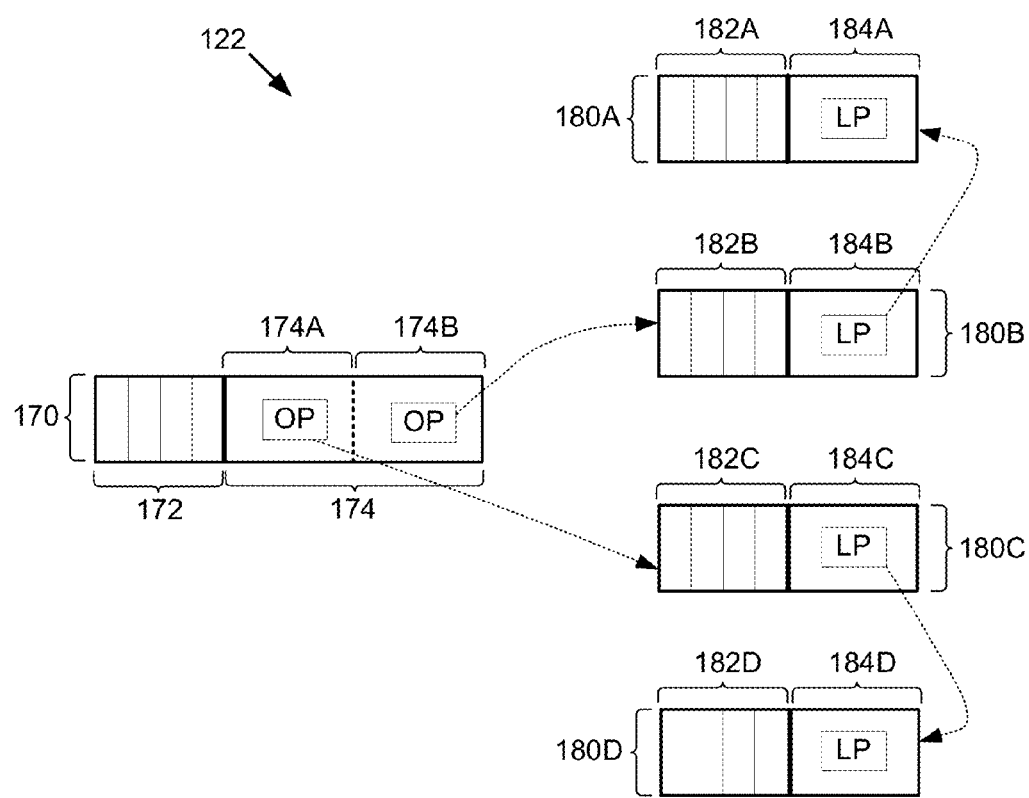
FIG. 1D is a block diagram of example data structures in accordance with one or more embodiments.

Referring now to FIG. 1D, shown is a block diagram of example data structures 122 in accordance with one or more embodiments. Specifically, FIG. 1D shows examples of a hash entry 170 and overflow entries 180A-180D (referred to collectively as overflow entries 180), in accordance with some embodiments.

As shown in FIG. 1D, the hash entry 170 can include a location portion 172 and an overflow portion 174. In some embodiments, the location portion 172 can include multiple location fields, and the overflow portion 174 can include two overflow pointer fields 174A-174B. Further, each overflow entry 180 can include a location portion 182 and a pointer portion 184. In some embodiments, the location portion 182 can include multiple location fields, and the pointer portion 184 may be a link pointer field.

As shown, in some embodiments, overflow pointer field 174A can include an overflow pointer to overflow entry 180C. Further, overflow pointer field 174B can include an overflow pointer to overflow entry 180B. Note that, in this example, the pointer portion 184C of overflow entry 180C includes a link pointer to overflow entry 180D. In addition, the pointer portion 184B of overflow entry 180B includes a link pointer to overflow entry 180A. Thus, the hash entry 170 is linked to two separate chains of overflow entries, namely a first chain including overflow entry 180B and overflow entry 180A, and a second chain including overflow entry 180C and overflow entry 180D. Thus, in this manner, the multiple overflow pointer fields 174A-174B may enable the hash entry 170 to link to multiple chains of overflow entries 180.

Note that, while FIGS. 1A-1D show various examples, embodiments are not limited in this regard. In particular, it is contemplated that the system 100 and/or the compression accelerator may include different components, additional components, different arrangements of components, and/or different numbers of components than shown in FIGS. 1A-1B. For example, the compression accelerator 120 may include a Huffman encoder (not shown). Further, referring to FIG. 1C, the hash table 140 and/or the overflow table 150 may include any number and arrangement of rows, columns, fields, and so forth. For example, in some embodiments, each overflow entry in the overflow table 150 may include a field (not shown) to store the hash value associated with the overflow entry. In some embodiments, the compression accelerator 120 may use such a hash value field to verify that overflow entries accessed via pointers are valid links to a given hash entry of the hash table 140. Further, in some embodiments, the hash table 140 may use the same field location (i.e., the field corresponding to the hash value field in the overflow entries) to store additional overflow pointers (e.g., as the overflow pointer field 174B shown in FIG. 1D).

Figure 2A:
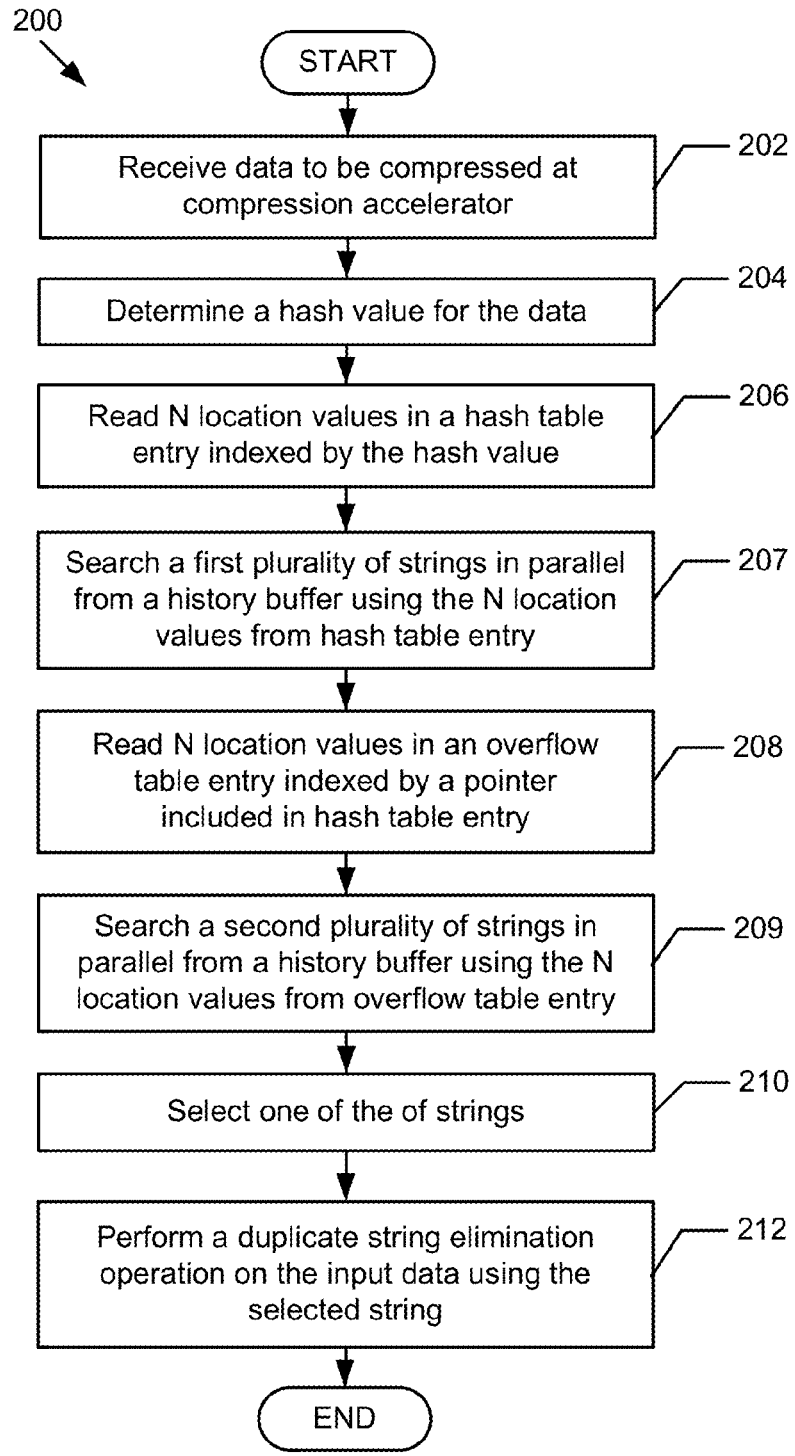
FIG. 2A is a sequence in accordance with one or more embodiments.

Referring now to FIG. 2A, shown is a sequence 200 in accordance with one or more embodiments. In some embodiments, the sequence 200 may be part of the compression accelerator 120 shown in FIGS. 1A-1C. The sequence 200 may be implemented in hardware, software, and/or firmware. In firmware and software embodiments it may be implemented by computer executed instructions stored in a non-transitory machine readable medium, such as an optical, semiconductor, or magnetic storage device. The machine readable medium may store data, which if used by at least one machine, causes the at least one machine to fabricate at least one integrated circuit to perform a method. For the sake of illustration, the steps involved in the sequence 200 may be described below with reference to FIGS. 1A-1C, which show examples in accordance with some embodiments. However, the scope of the various embodiments discussed herein is not limited in this regard.

At block 202, a hardware compression accelerator may receive input data to be compressed. For example, referring to FIGS. 1A-1B, the compression accelerator 120 can receive a string to be compressed.

At block 204, a hash value may be determined for the input data. For example, referring to FIGS. 1A-1B, the compression accelerator 120 can calculate a hash value of an input string (e.g., a byte, a set of bytes, etc.).

At block 206, the compression accelerator may read N location values included in a hash table entry indexed by the hash value. For example, referring to FIGS. 1A-1C, the compression accelerator 120 can read the location fields 142A-142D in hash entry 145 of the hash table 140, and thereby obtain a set of values corresponding to four different locations in the history buffer 160.

At block 207, a first plurality of strings may be searched performed in parallel from a history buffer based on the N location values obtained from the hash table entry. For example, referring to FIGS. 1A-1C, the comparators 128A-128N can perform separate parallel comparisons of the input data to the four strings obtained from the four locations identified by the location fields 142A-142D of a hash entry. In some embodiments, the locations may be included in the history buffer 160.

At block 208, the compression accelerator may read N location values included in an overflow table entry indexed by a pointer included in the hash table entry. For example, referring to FIGS. 1A-1C, the compression accelerator 120 can read the location fields 152A-152D in overflow entry 156 indexed by the pointer stored in the overflow pointer field 144 of hash entry 147, and thereby obtain a second set of values from the history buffer 160. In some embodiments, the compression accelerator 120 may use further pointers to read location fields in additional overflow entries.

At block 209, a second plurality of strings may be searched performed in parallel from a history buffer based on the location values obtained from the overflow table entry. For example, referring to FIGS. 1A-1C, the comparators 128A-128N can perform separate parallel comparisons of the input data to the four strings obtained from the four locations identified by the location fields 152A-152D of an overflow entry.

At block 210, one of the searched strings may be selected. For example, referring to FIGS. 1A-1C, the compression accelerator 120 can select a string stored in the history buffer 160 that is a best match for the input string. In some embodiments, the string that is selected as the best match includes the longest sequence of characters that matches the input data.

At block 212, a duplicate string elimination operation may be performed on the input data using the selected string. For example, referring to FIGS. 1A-1C, the compression accelerator 120 may encode the distance and length of the match to generate a distance/length pair. If there is no suitable match, the current string (e.g., a byte) is output as a literal without encoding. The compression accelerator 120 may process a stream of input data, and may generate an output stream of encoded distance/length pairs and literals. In some embodiments, the output stream may be an LZ77 stream. Further, in some embodiments, the output stream may be provided to a Huffman encoder for further compression. After block 212, the sequence 200 is completed.

Figure 2B:
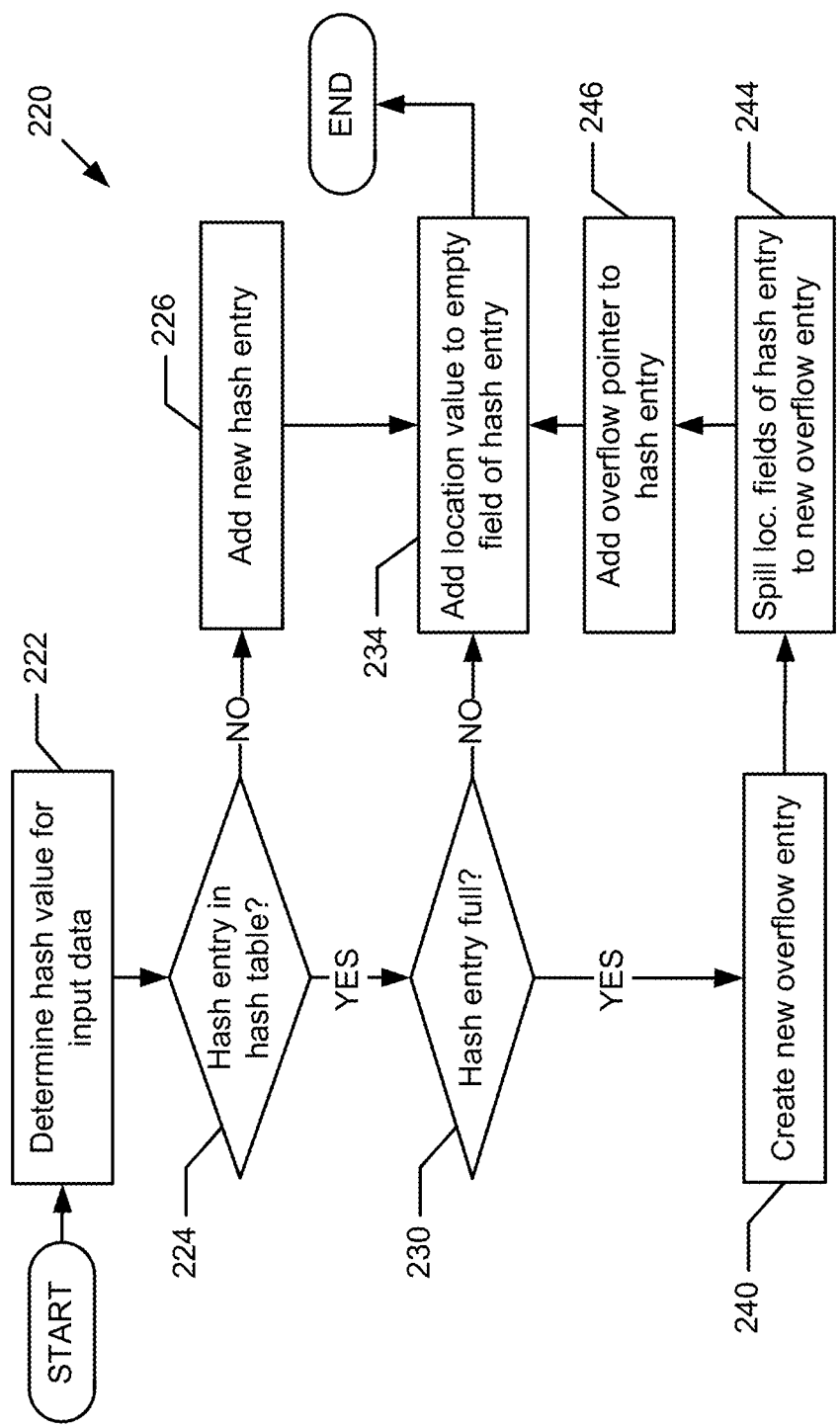
FIG. 2B is a sequence for a hash update operation in accordance with one or more embodiments.

Referring now to FIG. 2B, shown is a sequence 220 for a hash update operation in accordance with one or more embodiments. In some embodiments, the sequence 220 may be part of the compression accelerator 120 shown in FIGS. 1A-1B. The sequence 220 may be implemented in hardware, software, and/or firmware. In firmware and software embodiments it may be implemented by computer executed instructions stored in a non-transitory machine readable medium, such as an optical, semiconductor, or magnetic storage device. The machine readable medium may store data, which if used by at least one machine, causes the at least one machine to fabricate at least one integrated circuit to perform a method. For the sake of illustration, the steps involved in the sequence 220 may be described below with reference to FIGS. 1A-1C, which show examples in accordance with some embodiments. However, the scope of the various embodiments discussed herein is not limited in this regard.

At block 222, a hash value for input data may be determined. For example, referring to FIGS. 1A-1B, the compression accelerator 120 can calculate a hash value of an input string (e.g., a byte, a set of bytes, etc.).

At block 224, a determination is made about whether a hash entry corresponding to the hash value already exists in a hash table. For example, referring to FIGS. 1A-1C, the compression accelerator 120 may determine whether the hash table 140 includes a hash entry indexed to the hash value of the input data.

If it is determined at block 224 that a hash entry corresponding to the hash value does not exist in the hash table, then at block 226, a new hash entry is added to the hash table. For example, referring to FIGS. 1A-1C, the compression accelerator 120 may determine that the hash table 140 does not include a hash entry associated with the hash value, and may then add a new hash entry to the hash table 140.

At block 234, the location of the input data may be added to an empty field of hash entry. For example, referring to FIGS. 1A-1C, the compression accelerator 120 may shift the location values stored in location fields 142A-142B of hash entry 146 over by one field, and may store the location value of the input string in location field 142A of hash entry 146. After block 234, the sequence 220 may be completed.

However, if it is determined at block 224 that a hash entry corresponding to the hash value does not exist in the hash table, then at block 230, a determination is made about whether all location fields in the hash entry are full (i.e., are already populated with location values). For example, referring to FIGS. 1A-1C, the compression accelerator 120 may determine whether all of the location fields 142A-142D of hash entry 146 are full.

If it is determined at block 230 that all location fields in the hash entry are not full, then the sequence 220 may continue at block 234 (described above). After block 234, the sequence 220 may be completed.

However, if it is determined at block 230 that all location fields in the hash entry are full, then at block 240, a new overflow entry may be created in an overflow table. For example, referring to FIGS. 1A-1C, the compression accelerator 120 can create a new overflow entry in overflow table 150. In some embodiments, in the event that a previous overflow entry was already associated with the hash entry, the link pointer field 154 of the new overflow entry may be populated with a link pointer to the previous overflow entry. For example, referring to FIG. 1C, the link pointer field 154 of overflow entry 156 includes a link pointer to overflow entry 158.

At block 244, the location fields of the hash entry may be spilled to the new overflow entry. At block 246, a pointer to the new overflow entry may be added to the overflow pointer field of the hash entry. For example, referring to FIGS. 1A-1C, the compression accelerator 120 may move the location fields of the hash entry to the new overflow entry, and may populate the overflow pointer field of the hash entry. After block 246, the sequence 220 may continue at block 234 (described above). After block 234, the sequence 220 may be completed.

Figure 2C:
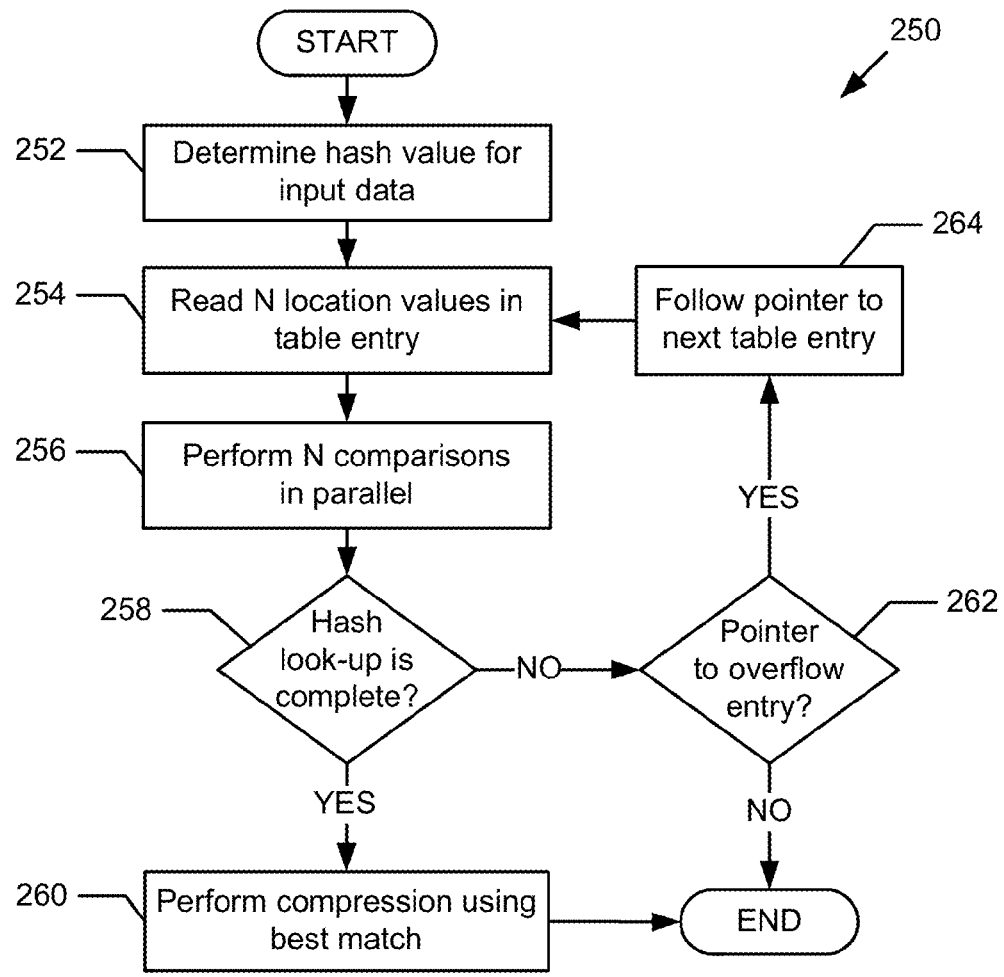
FIG. 2C is a sequence for a hash look-up operation in accordance with one or more embodiments.

Referring now to FIG. 2C, shown is a sequence 250 for a hash look-up operation in accordance with one or more embodiments. In some embodiments, the sequence 220 may be part of the compression accelerator 120 shown in FIGS. 1A-1B. The sequence 250 may be implemented in hardware, software, and/or firmware. In firmware and software embodiments it may be implemented by computer executed instructions stored in a non-transitory machine readable medium, such as an optical, semiconductor, or magnetic storage device. The machine readable medium may store data, which if used by at least one machine, causes the at least one machine to fabricate at least one integrated circuit to perform a method. For the sake of illustration, the steps involved in the sequence 250 may be described below with reference to FIGS. 1A-1C, which show examples in accordance with some embodiments. However, the scope of the various embodiments discussed herein is not limited in this regard.

At block 252, a hash value for input data may be determined. For example, referring to FIGS. 1A-1B, the compression accelerator 120 can calculate a hash value of an input string (e.g., a byte, a set of bytes, etc.).

At block 254, the N location values included in a table entry associated with the hash value may be read. For example, referring to FIGS. 1A-1C, the compression accelerator 120 can read the location fields 142A-142D in hash entry 145 of the hash table 140, and thereby obtain values corresponding to four different locations in the history buffer 160.

At block 256, a set of N comparisons may be performed in parallel using the N location values obtained from the table entry. For example, referring to FIGS. 1A-1C, each of the comparators 128A-128N can perform a separate comparison of the input data to a different string stored in the history buffer 160.

At block 258, a determination is made about whether the hash look-up operation is complete. For example, referring to FIGS. 1A-1C, the compression accelerator 120 may determine whether the search for a matching string has satisfied a minimum threshold (e.g., length of match, duration of search, number of links, and so forth). If it is determined at block 258 that the hash look-up operation is complete, then at block 260, a compression operation may be performed using the best match found. For example, referring to FIGS. 1A-1C, the compression accelerator 120 may perform an LZ77 algorithm using the longest matching string found during the hash look-up operation. After block 260, the sequence 250 may be completed.

However, if it is determined at block 258 that the hash look-up operation is not complete, then at block 262, a determination is made about whether there is a pointer to an overflow entry. For example, referring to FIGS. 1A-1C, the compression accelerator 120 may determine whether the overflow pointer field 144 of hash entry 147 includes a pointer to an overflow entry in the overflow table 150. In another example, the compression accelerator 120 may determine whether the link pointer field 154 of overflow entry 156 includes a pointer to another overflow entry in the overflow table 150.

If it is determined at block 262 that there is a pointer to an overflow entry, then at block 264, the pointer may be followed to the overflow entry. For example, referring to FIGS. 1A-1C, the compression accelerator 120 may use overflow pointer field 144 of hash entry 147 to read the overflow entry 156. In another example, the compression accelerator 120 may use link pointer field 154 of overflow entry 156 to read the overflow entry 158. After block 264, the sequence 220 may return to block 254 (described above). For example, referring to FIGS. 1A-1C, the compression accelerator 120 may read the location fields 152A-152D in overflow entry 156 or in overflow entry 158. However, if it is determined at block 262 that there is no pointer to an overflow entry, then the sequence 220 may be completed.

Note that the examples shown in FIGS. 1A-1D and 2A-2C are provided for the sake of illustration, and are not intended to limit any embodiments. It is contemplated that specifics in the examples shown in FIGS. 1A-1D and 2A-2C may be used anywhere in one or more embodiments.

Figure 3A:
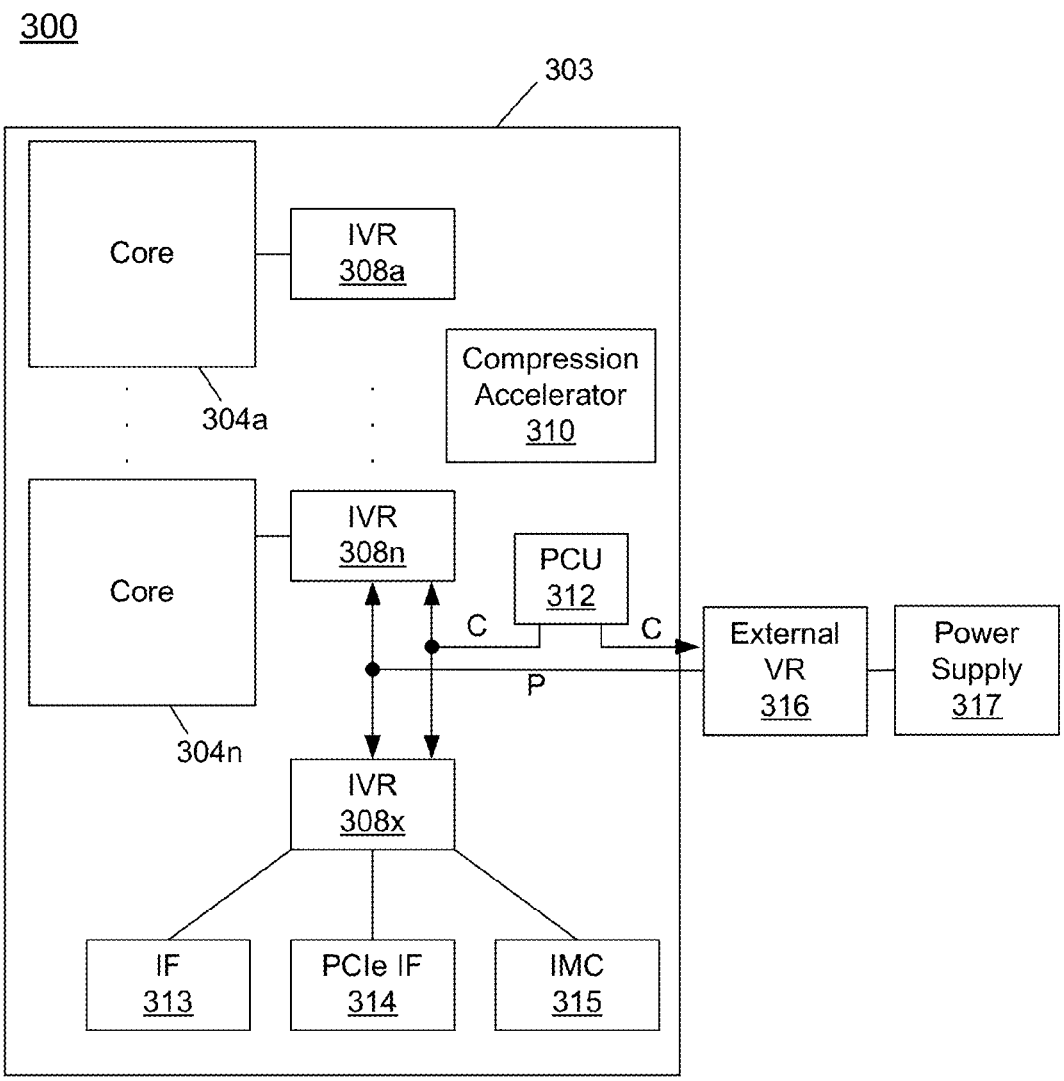
FIG. 3A is a block diagram of a portion of a system in accordance with one or more embodiments.

Referring now to FIG. 3A, shown is a block diagram of a system 300 in accordance with an embodiment of the present invention. As shown in FIG. 3A, system 300 may include various components, including a processor 303 which as shown is a multicore processor. Processor 303 may be coupled to a power supply 317 via an external voltage regulator 316, which may perform a first voltage conversion to provide a primary regulated voltage to processor 303.

As seen, processor 303 may be a single die processor including multiple cores $304_a$-$304_n$. In addition, each core 304 may be associated with an integrated voltage regulator (IVR) $308_a$-$308_n$ which receives the primary regulated voltage and generates an operating voltage to be provided to one or more agents of the processor associated with the IVR 308. Accordingly, an IVR implementation may be provided to allow for fine-grained control of voltage and thus power and performance of each individual core 304. As such, each core 304 can operate at an independent voltage and frequency, enabling great flexibility and affording wide opportunities for balancing power consumption with performance. In some embodiments, the use of multiple IVRs 308 enables the grouping of components into separate power planes, such that power is regulated and supplied by the IVR 308 to only those components in the group. During power management, a given power plane of one IVR 308 may be powered down or off when the processor is placed into a certain low power state, while another power plane of another IVR 308 remains active, or fully powered.

Still referring to FIG. 3A, additional components may be present within the processor including an input/output interface 313, another interface 314, and an integrated memory controller 315. As seen, each of these components may be powered by another integrated voltage regulator $308_x$. In one embodiment, interface 313 may be in accordance with the Intel® Quick Path Interconnect (QPI) protocol, which provides for point-to-point (PtP) links in a cache coherent protocol that includes multiple layers including a physical layer, a link layer and a protocol layer. In turn, interface 314 may be in accordance with a Peripheral Component Interconnect Express (PCIe™) specification, e.g., the PCI Express™ Specification Base Specification version 2.0 (published Jan. 17, 2007).

Also shown is a power control unit (PCU) 312, which may include hardware, software and/or firmware to perform power management operations with regard to processor 303. As seen, PCU 312 provides control information to external voltage regulator 316 via a digital interface to cause the external voltage regulator 316 to generate the appropriate regulated voltage. PCU 312 also provides control information to IVRs 308 via another digital interface to control the operating voltage generated (or to cause a corresponding IVR 308 to be disabled in a low power mode). In some embodiments, the control information provided to IVRs 308 may include a power state of a corresponding core 304.

In various embodiments, PCU 312 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or management power management source or system software).

In some embodiments, the compression accelerator 310 may generally correspond to the compression accelerator 120 shown in FIGS. 1A-1B. In some embodiments, the processor 303 may implement some or all of the components and/or functionality described above with reference to FIGS. 1A-1D and 2A-2C. While not shown for ease of illustration, understand that additional components may be present within processor 303 such as uncore logic, and other components such as internal memories, e.g., one or more levels of a cache memory hierarchy and so forth. Furthermore, while shown in the implementation of FIG. 3A with an external voltage regulator, embodiments are not so limited.

Figure 3B:
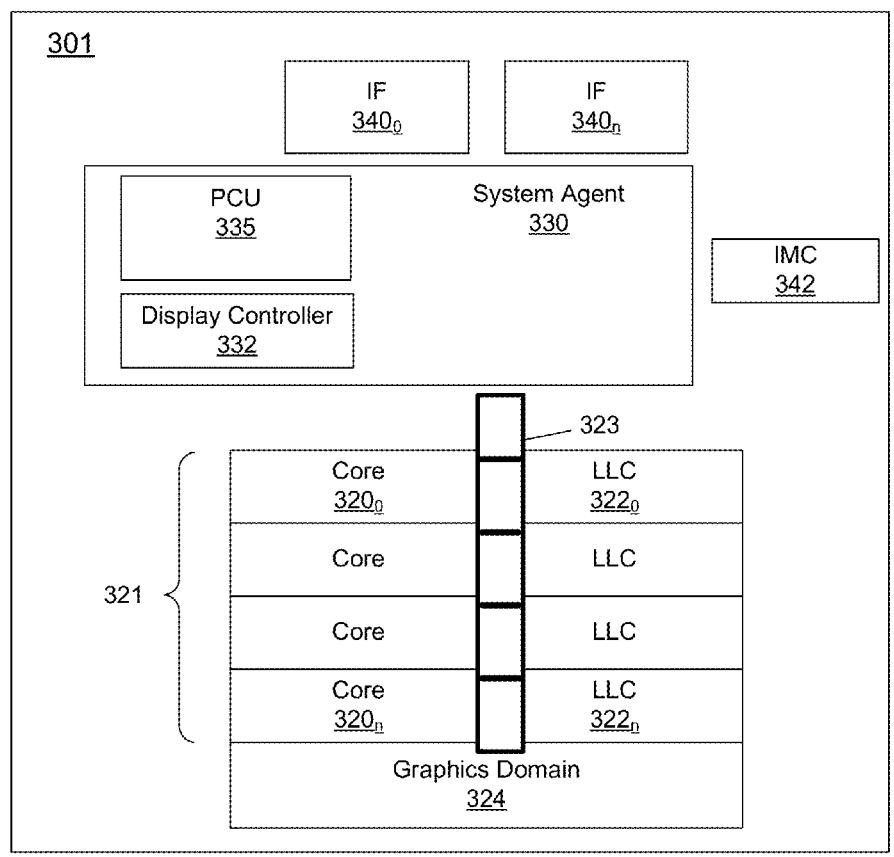
FIG. 3B is a block diagram of a multi-domain processor in accordance with one or more embodiments.

Embodiments can be implemented in processors for various markets including server processors, desktop processors, mobile processors and so forth. Referring now to FIG. 3B, shown is a block diagram of a multi-domain processor 301 in accordance with one or more embodiments. As shown in the embodiment of FIG. 3B, processor 301 includes multiple domains. Specifically, a core domain 321 can include a plurality of cores $320_0$-$320_n$, a graphics domain 324 can include one or more graphics engines, and a system agent domain 330 may further be present. In some embodiments, system agent domain 330 may execute at an independent frequency than the core domain and may remain powered on at all times to handle power control events and power management such that domains 321 and 324 can be controlled to dynamically enter into and exit high power and low power states. Each of domains 321 and 324 may operate at different voltage and/or power. Note that while only shown with three domains, understand the scope of the present invention is not limited in this regard and additional domains can be present in other embodiments. For example, multiple core domains may be present, with each core domain including at least one core.

In general, each core 320 may further include low level caches in addition to various execution units and additional processing elements. In turn, the various cores may be coupled to each other and to a shared cache memory formed of a plurality of units of a last level cache (LLC) $322_0$-$322_n$. In various embodiments, LLC 322 may be shared amongst the cores and the graphics engine, as well as various media processing circuitry. As seen, a ring interconnect 323 thus couples the cores together, and provides interconnection between the cores 320, graphics domain 324 and system agent domain 330. In one embodiment, interconnect 323 can be part of the core domain 321. However, in other embodiments, the ring interconnect 323 can be of its own domain.

As further seen, system agent domain 330 may include display controller 332 which may provide control of and an interface to an associated display. In addition, system agent domain 330 may include a power control unit 335 to perform power management.

As further seen in FIG. 3B, processor 301 can further include an integrated memory controller (IMC) 342 that can provide for an interface to a system memory, such as a dynamic random access memory (DRAM). Multiple interfaces $340_0$-$340_n$ may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more interfaces in accordance with an Intel® Quick Path Interconnect (QPI) protocol may also be provided. Although shown at this high level in the embodiment of FIG. 3B, understand the scope of the present invention is not limited in this regard.

Although not shown for ease of illustration in FIG. 3B, in some embodiments, processor 301 may include the compression accelerator 120 described above with reference to FIGS. 1A-1B. Further, in some embodiments, processor 301 may implement some or all of the components and/or functionality described above with reference to FIGS. 1A-1D and 2A-2C.

While not shown for ease of illustration, understand that additional components may be present within processor 303 such as uncore logic, and other components such as internal memories, e.g., one or more levels of a cache memory hierarchy and so forth. Furthermore, while shown in the implementation of FIG. 3A with an external voltage regulator, embodiments are not so limited.

Figure 3C:
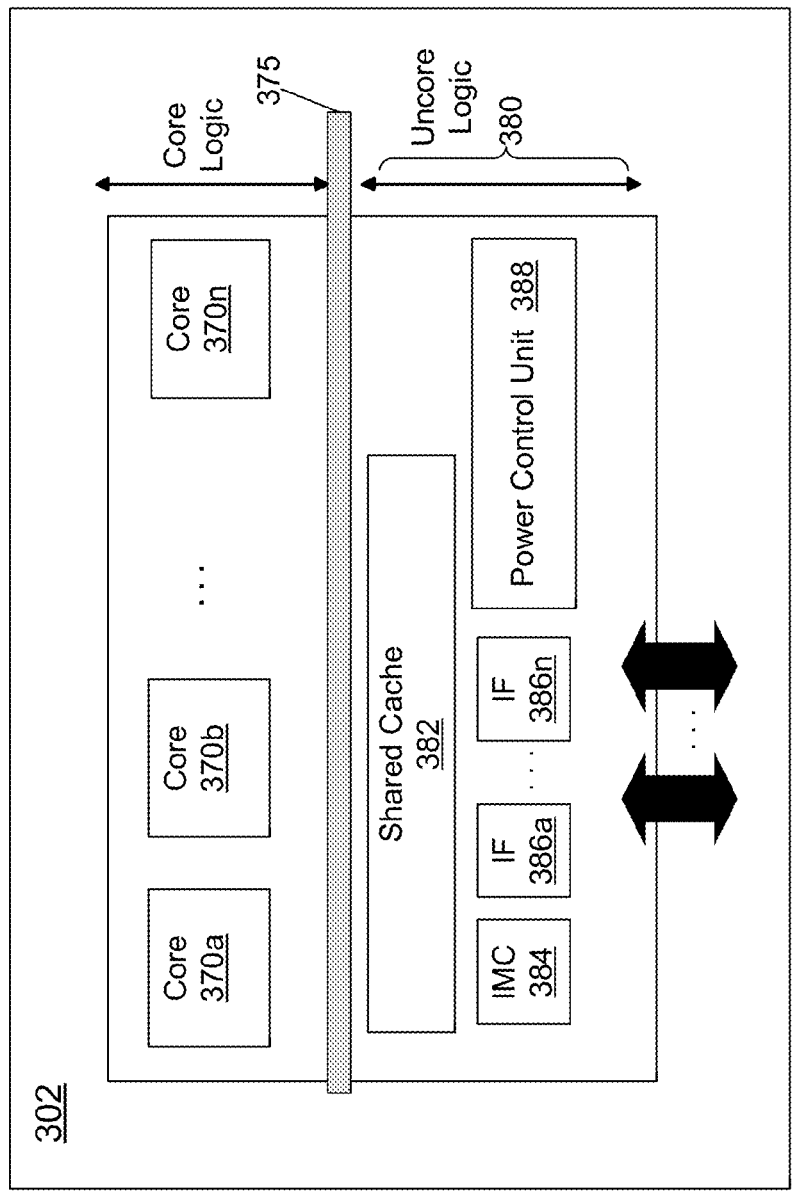
FIG. 3C is a block diagram of a processor in accordance with one or more embodiments.

Referring now to FIG. 3C, shown is a block diagram of a processor 302 in accordance with an embodiment of the present invention. As shown in FIG. 3C, processor 302 may be a multicore processor including a plurality of cores $370_a$-$370_n$. In one embodiment, each such core may be of an independent power domain and can be configured to enter and exit active states and/or maximum performance states based on workload. The various cores may be coupled via an interconnect 375 to a system agent or uncore 380 that includes various components. As seen, the uncore 380 may include a shared cache 382 which may be a last level cache. In addition, the uncore 380 may include an integrated memory controller 384 to communicate with a system memory (not shown in FIG. 3C), e.g., via a memory bus. Uncore 380 also includes various interfaces 386a-386n and a power control unit 388, which may include logic to perform the power management techniques described herein.

In addition, by interfaces 386a-386n, connection can be made to various off-chip components such as peripheral devices, mass storage and so forth. While shown with this particular implementation in the embodiment of FIG. 3C, the scope of the present invention is not limited in this regard.

Although not shown for ease of illustration in FIG. 3C, in some embodiments, processor 302 may include the compression accelerator 120 described above with reference to FIGS. 1A-1B. Further, in some embodiments, processor 302 may implement some or all of the components and/or functionality described above with reference to FIGS. 1A-1D and 2A-2C.

Figure 4:
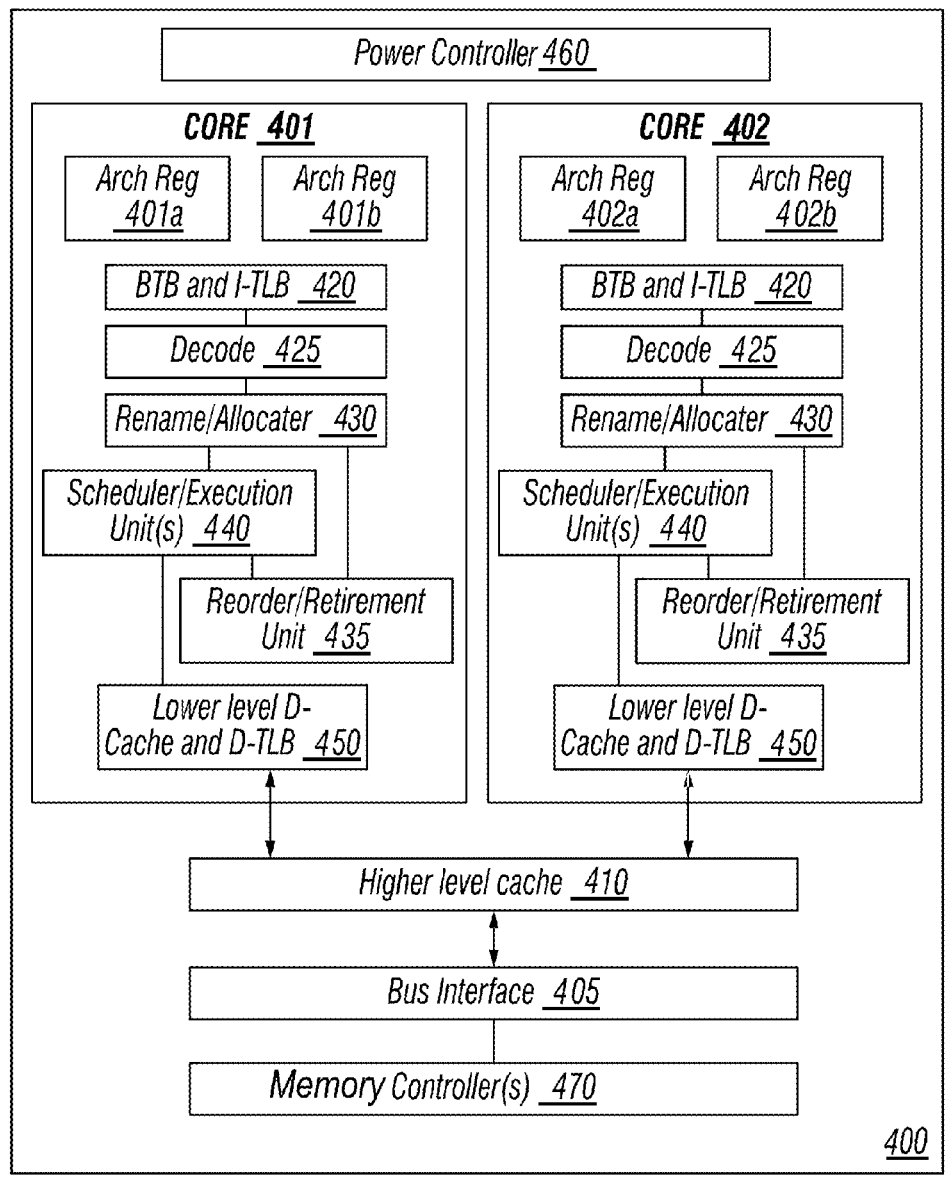
FIG. 4 is a block diagram of a processor including multiple cores in accordance with one or more embodiments.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two hardware threads 401a and 401b, which may also be referred to as hardware thread slots 401a and 401b. Therefore, software entities, such as an operating system, in one embodiment potentially view processor 400 as four separate processors, i.e., four logical processors or processing elements capable of executing four software threads concurrently. As alluded to above, a first thread is associated with architecture state registers 401a, a second thread is associated with architecture state registers 401b, a third thread may be associated with architecture state registers 402a, and a fourth thread may be associated with architecture state registers 402b. Here, each of the architecture state registers (401a, 401b, 402a, and 402b) may be referred to as processing elements, thread slots, or thread units, as described above. As illustrated, architecture state registers 401a are replicated in architecture state registers 401b, so individual architecture states/contexts are capable of being stored for logical processor 401a and logical processor 401b. In core 401, other smaller resources, such as instruction pointers and renaming logic in allocator and renamer block 430 may also be replicated for threads 401a and 401b. Some resources, such as re-order buffers in reorder/retirement unit 435, ILTB 420, load/store buffers, and queues may be shared through partitioning. Other resources, such as general purpose internal registers, page-table base register(s), low-level data-cache and data-TLB 415, execution unit(s) 440, and portions of out-of-order unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments. The OOO core includes a branch target buffer 420 to predict branches to be executed/taken and an instruction-translation buffer (I-TLB) 420 to store address translation entries for instructions.

Core 401 further includes decode module 425 coupled to fetch unit 420 to decode fetched elements. Fetch logic, in one embodiment, includes individual sequencers associated with thread slots 401a, 401b, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode logic 425 includes circuitry that recognizes these instructions from their opcodes and passes the decoded instructions on in the pipeline for processing as defined by the first ISA. For example, decoders 425, in one embodiment, include logic designed or adapted to recognize specific instructions, such as transactional instruction. As a result of the recognition by decoders 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401a and 401b are potentially capable of out-of-order execution, where allocator and renamer block 430 also reserves other resources, such as reorder buffers to track instruction results. Unit 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder 425 to store recently decoded traces.

In the depicted configuration, processor 400 also includes bus interface module 405 and a power controller 460, which may perform power management in accordance with an embodiment of the present invention. In this scenario, bus interface 405 is to communicate with devices external to processor 400, such as system memory and other components.

A memory controller 470 may interface with other devices such as one or many memories. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Although not shown for ease of illustration in FIG. 4, in some embodiments, processor 400 may include the compression accelerator 120 described above with reference to FIGS. 1A-1B. Further, in some embodiments, processor 400 may implement some or all of the components and/or functionality described above with reference to FIGS. 1A-1D and 2A-2C.

Figure 5:
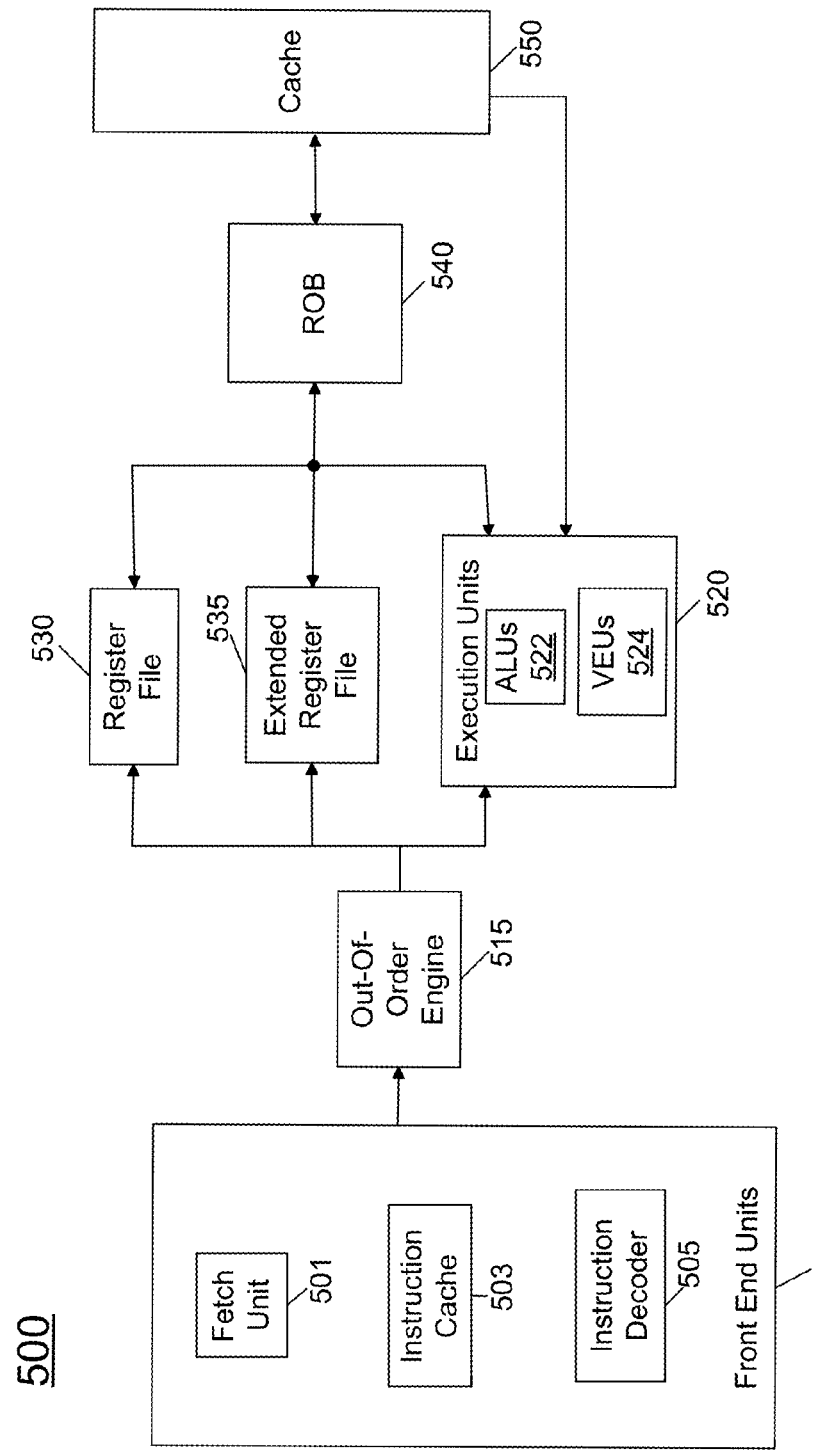
FIG. 5 is a block diagram of a micro-architecture of a processor core in accordance with one or more embodiments.

Referring now to FIG. 5, shown is a block diagram of a micro-architecture of a processor core in accordance with one embodiment of the present invention. As shown in FIG. 5, processor core 500 may be a multi-stage pipelined out-of-order processor. Core 500 may operate at various voltages based on a received operating voltage, which may be received from an integrated voltage regulator or external voltage regulator.

As seen in FIG. 5, core 500 includes front end units 510, which may be used to fetch instructions to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. Extended register file 535 may provide storage for vector-sized units, e.g., 256 or 512 bits per register.

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Although not shown for ease of illustration in FIG. 5, in some embodiments, the core 500 may include the compression accelerator 120 described above with reference to FIGS. 1A-1B. Further, in some embodiments, the core 500 may implement some or all of the components and/or functionality described above with reference to FIGS. 1A-1D and 2A-2C.

Figure 6:
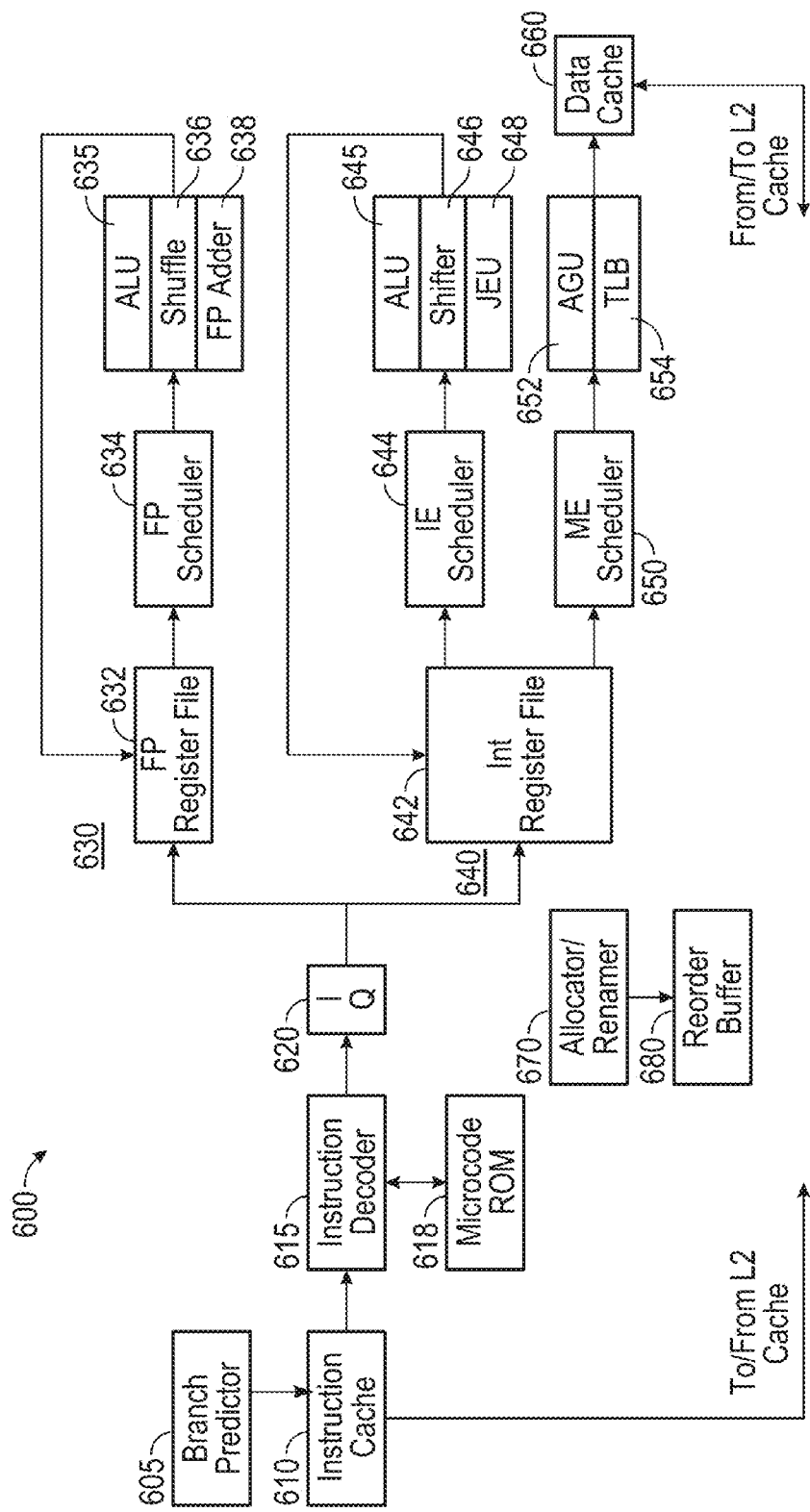
FIG. 6 is a block diagram of a micro-architecture of a processor core in accordance with one or more embodiments.

Referring now to FIG. 6, shown is a block diagram of a micro-architecture of a processor core in accordance with another embodiment. In the embodiment of FIG. 6, core 600 may be a low power core of a different micro-architecture, such as an Intel® Atom™-based processor having a relatively limited pipeline depth designed to reduce power consumption. As seen, core 600 includes an instruction cache 610 coupled to provide instructions to an instruction decoder 615. A branch predictor 605 may be coupled to instruction cache 610. Note that instruction cache 610 may further be coupled to another level of a cache memory, such as an L2 cache (not shown for ease of illustration in FIG. 6). In turn, instruction decoder 615 provides decoded instructions to an issue queue 620 for storage and delivery to a given execution pipeline. A microcode ROM 618 is coupled to instruction decoder 615.

A floating point pipeline 630 includes a floating point register file 632 which may include a plurality of architectural registers of a given bit with such as 128, 256 or 512 bits. Pipeline 630 includes a floating point scheduler 634 to schedule instructions for execution on one of multiple execution units of the pipeline. In the embodiment shown, such execution units include an ALU 635, a shuffle unit 636, and a floating point adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer register file 642 which may include a plurality of architectural registers of a given bit with such as 128 or 256 bits. Pipeline 640 includes an integer scheduler 644 to schedule instructions for execution on one of multiple execution units of the pipeline. In the embodiment shown, such execution units include an ALU 645, a shifter unit 646, and a jump execution unit 648. In turn, results generated in these execution units may be provided back to buffers and/or registers of register file 642. Of course understand while shown with these few example execution units, additional or different integer execution units may be present in another embodiment.

A memory execution scheduler 650 may schedule memory operations for execution in an address generation unit 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Although not shown for ease of illustration in FIG. 6, in some embodiments, the core 600 may include the compression accelerator 120 described above with reference to FIGS. 1A-1B. Further, in some embodiments, the core 600 may implement some or all of the components and/or functionality described above with reference to FIGS. 1A-1D and 2A-2C.

Figure 7:
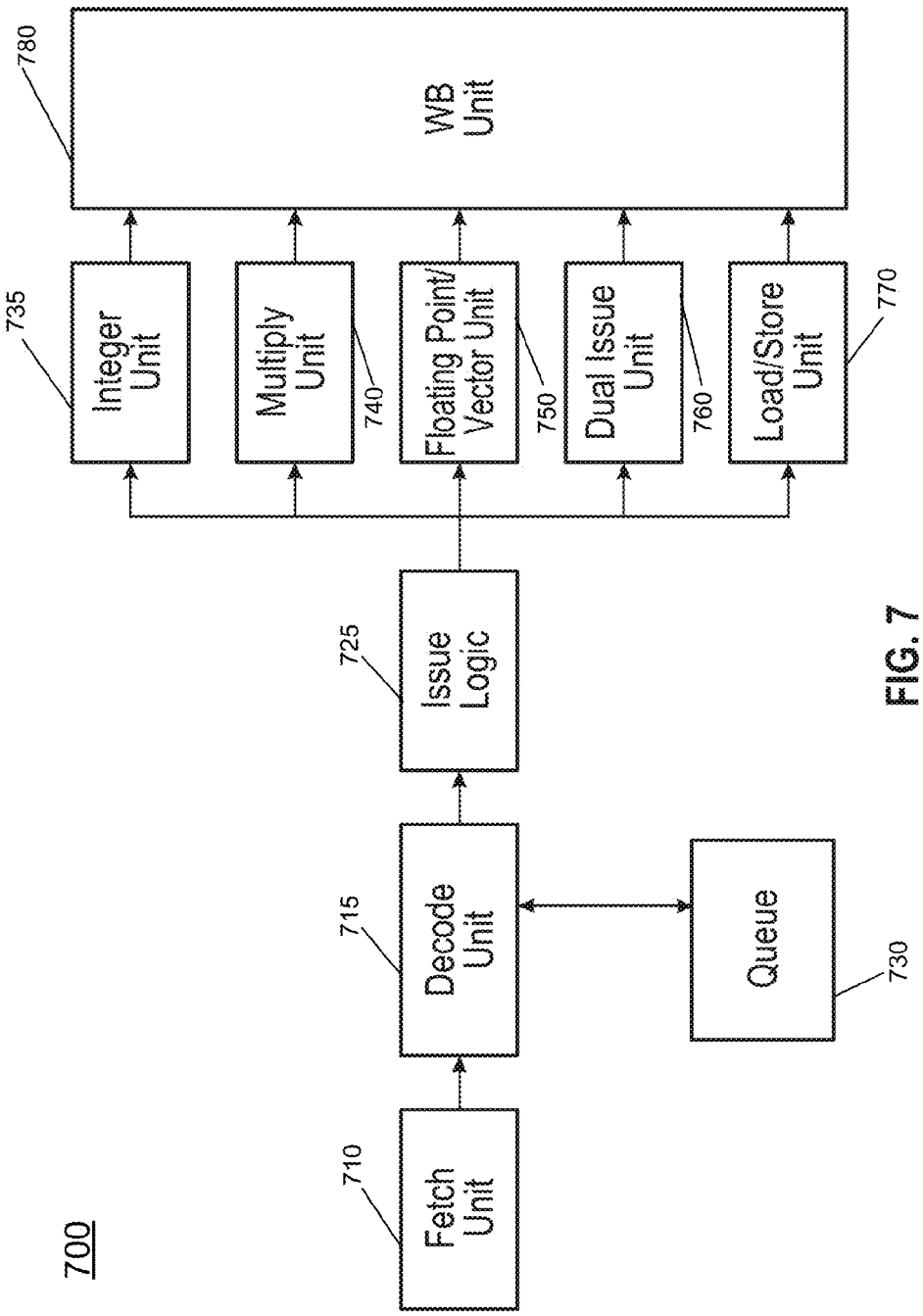
FIG. 7 is a block diagram of a micro-architecture of a processor core in accordance with one or more embodiments.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, processor 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Although not shown for ease of illustration in FIG. 7, in some embodiments, the core 700 may include the compression accelerator 120 described above with reference to FIGS. 1A-1B. Further, in some embodiments, the core 700 may implement some or all of the components and/or functionality described above with reference to FIGS. 1A-1D and 2A-2C.

Figure 8:
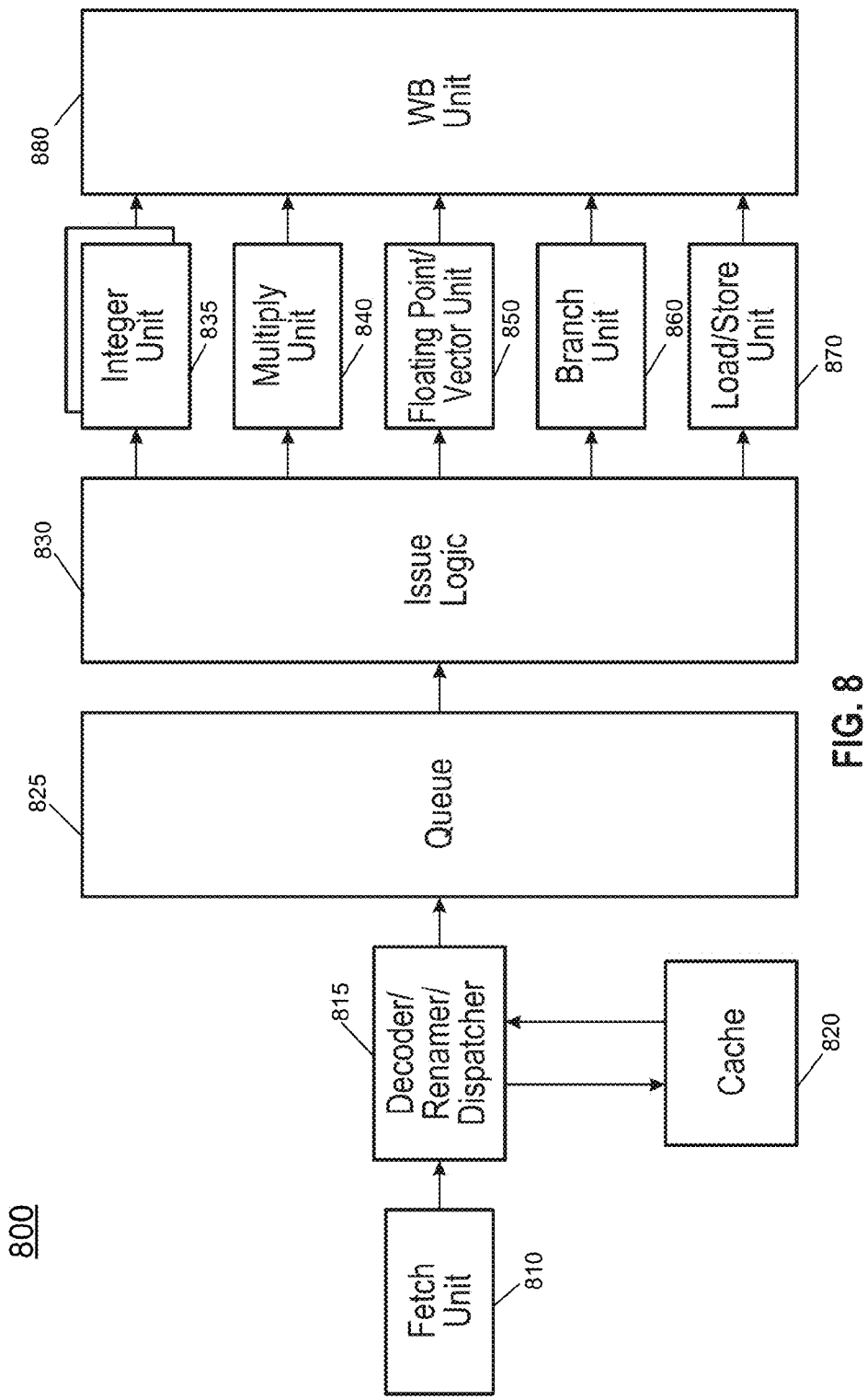
FIG. 8 is a block diagram of a micro-architecture of a processor core in accordance with one or more embodiments.

Referring now to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions and provide them to a decoder/renamer/dispatcher 815, which may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Although not shown for ease of illustration in FIG. 8, in some embodiments, the core 800 may include the compression accelerator 120 described above with reference to FIGS. 1A-1B. Further, in some embodiments, the core 800 may implement some or all of the components and/or functionality described above with reference to FIGS. 1A-1D and 2A-2C.

Figure 9:
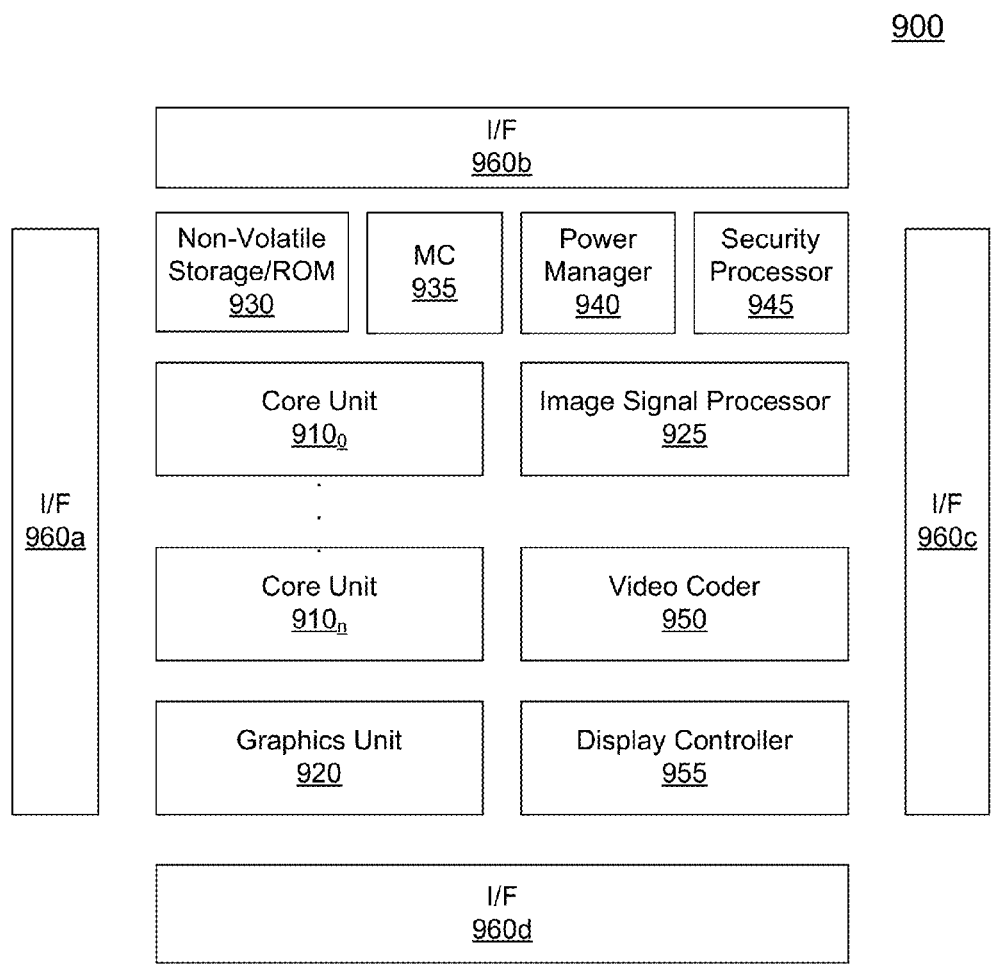
FIG. 9 is a block diagram of a processor in accordance with one or more embodiments.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer or other portable computing device.

In the high level view shown in FIG. 9, processor 900 includes a plurality of core units $910_0$-$910_n$. Each core unit may include one or more processor cores, one or more cache memories and other circuitry. Each core unit 910 may support one or more instructions sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 9).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein.

In some embodiments, SoC 900 may further include a non-coherent fabric coupled to the coherent fabric to which various peripheral devices may couple. One or more interfaces 960a-960d enable communication with one or more off-chip devices. Such communications may be according to a variety of communication protocols such as PCIe™ GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Although not shown for ease of illustration in FIG. 9, in some embodiments, the SoC 900 may include the compression accelerator 120 described above with reference to FIGS. 1A-1B. Further, in some embodiments, the SoC 900 may implement some or all of the components and/or functionality described above with reference to FIGS. 1A-1D and 2A-2C.

Figure 10:
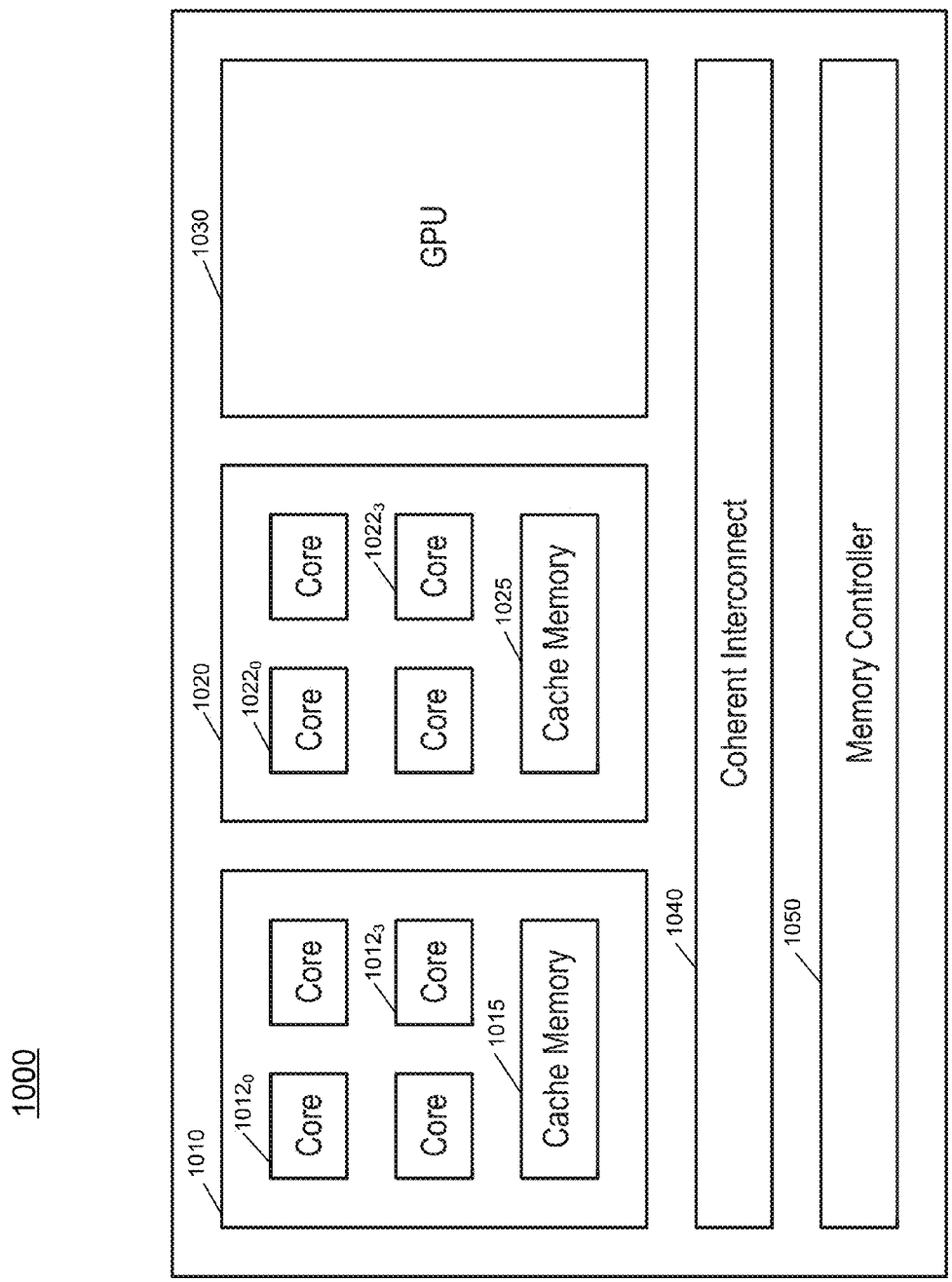
FIG. 10 is a block diagram of a representative SoC in accordance with one or more embodiments.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device. As an example, SoC 1000 may be implemented using asymmetric or different types of cores, such as combinations of higher power and/or low power cores, e.g., out-of-order cores and in-order cores. In different embodiments, these cores may be based on an Intel® Architecture™ core design or an ARM architecture design. In yet other embodiments, a mix of Intel and ARM cores may be implemented in a given SoC.

As seen in FIG. 10, SoC 1000 includes a first core domain 1010 having a plurality of first cores $1012_0$-$1012_3$. In an example, these cores may be low power cores such as in-order cores. In one embodiment these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores $1022_0$-$1022_3$. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, some examples. In an embodiment, memory controller 1050 may be a direct memory controller to provide for multiple channels of communication with an off-chip memory, such as multiple channels of a DRAM (not shown for ease of illustration in FIG. 10).

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Although not shown for ease of illustration in FIG. 10, in some embodiments, the SoC 1000 may include the compression accelerator 120 described above with reference to FIGS. 1A-1B. Further, in some embodiments, the SoC 1000 may implement some or all of the components and/or functionality described above with reference to FIGS. 1A-1D and 2A-2C.

Figure 11:
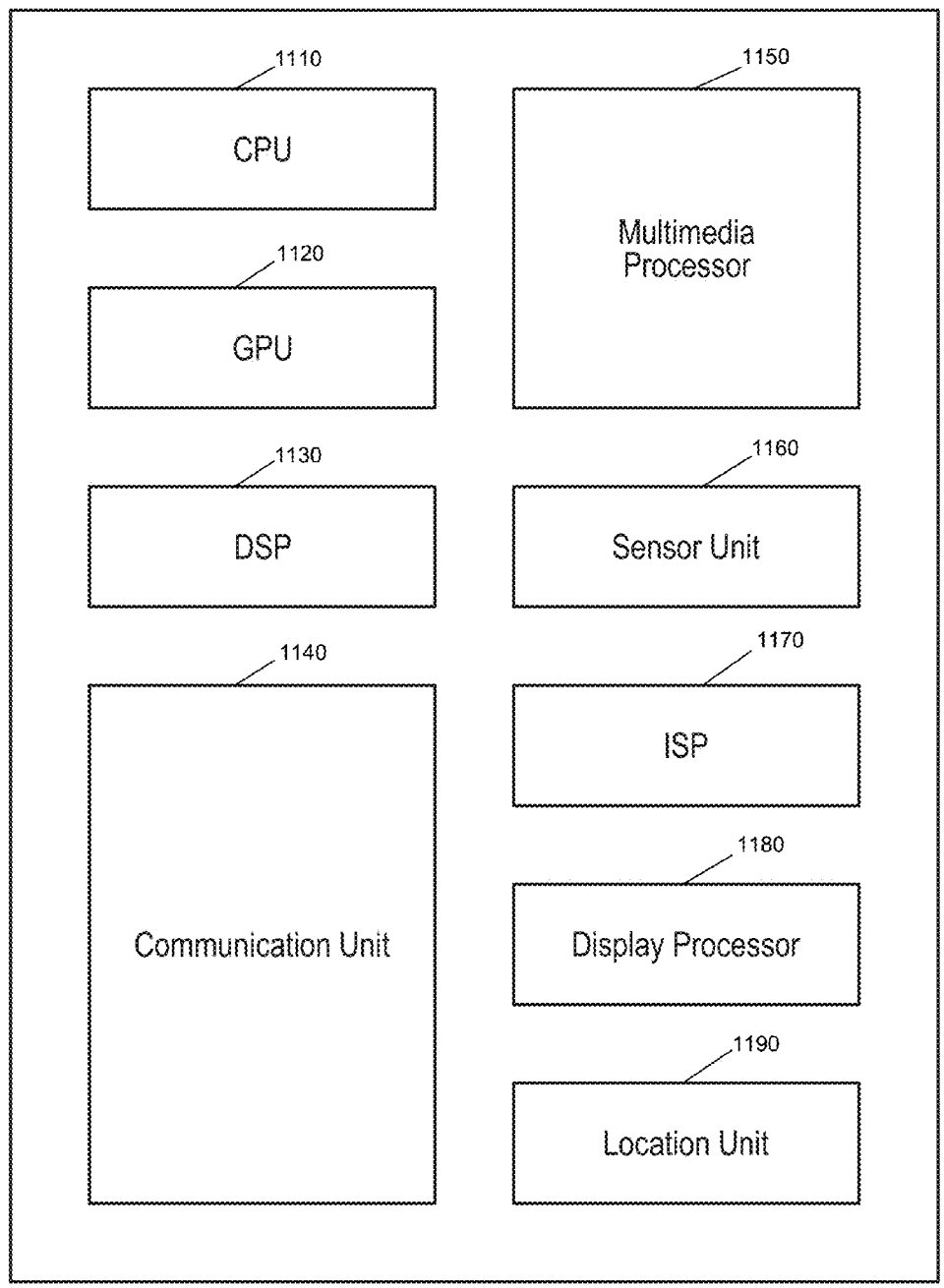
FIG. 11 is a block diagram of another example SoC in accordance with one or more embodiments.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area techniques such as Bluetooth™, IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor 1170 may be provided with one or more separate ISPs to perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a GPS receiver with support for multiple GPS constellations to provide applications highly accurate positioning information obtained using as such GPS receiver. Understand that while shown with this particular set of components in the example of FIG. 11, many variations and alternatives are possible.

Although not shown for ease of illustration in FIG. 11, in some embodiments, the SoC 1100 may include the compression accelerator 120 described above with reference to FIGS. 1A-1B. Further, in some embodiments, the SoC 1100 may implement some or all of the components and/or functionality described above with reference to FIGS. 1A-1D and 2A-2C.

Figure 12:
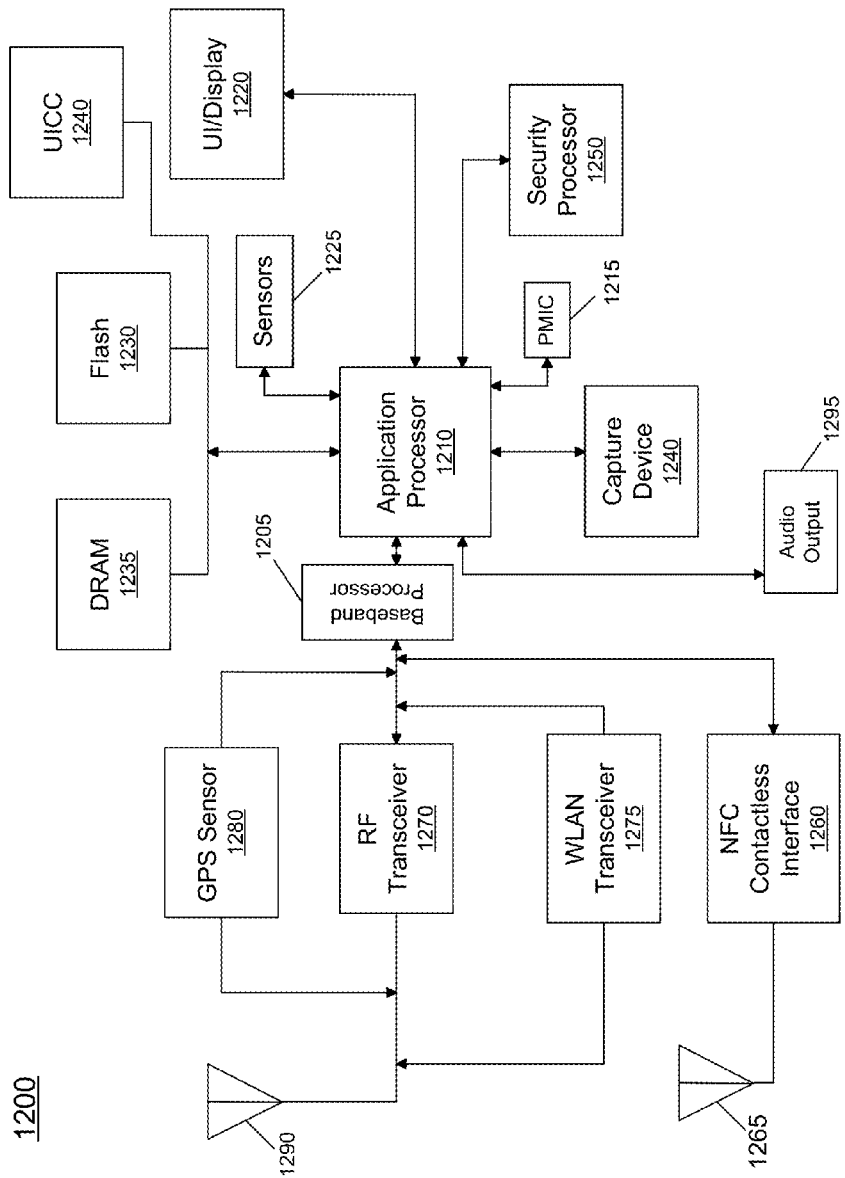
FIG. 12 is a block diagram of an example system with which one or more embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 12, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications, such as according to a Bluetooth™ standard or an IEEE 802.11 standard such as IEEE 802.11a/b/g/n can also be realized.

Although not shown for ease of illustration in FIG. 12, in some embodiments, the system 1200 may include the compression accelerator 120 described above with reference to FIGS. 1A-1B. Further, in some embodiments, the system 1200 may implement some or all of the components and/or functionality described above with reference to FIGS. 1A-1D and 2A-2C.

Figure 13:
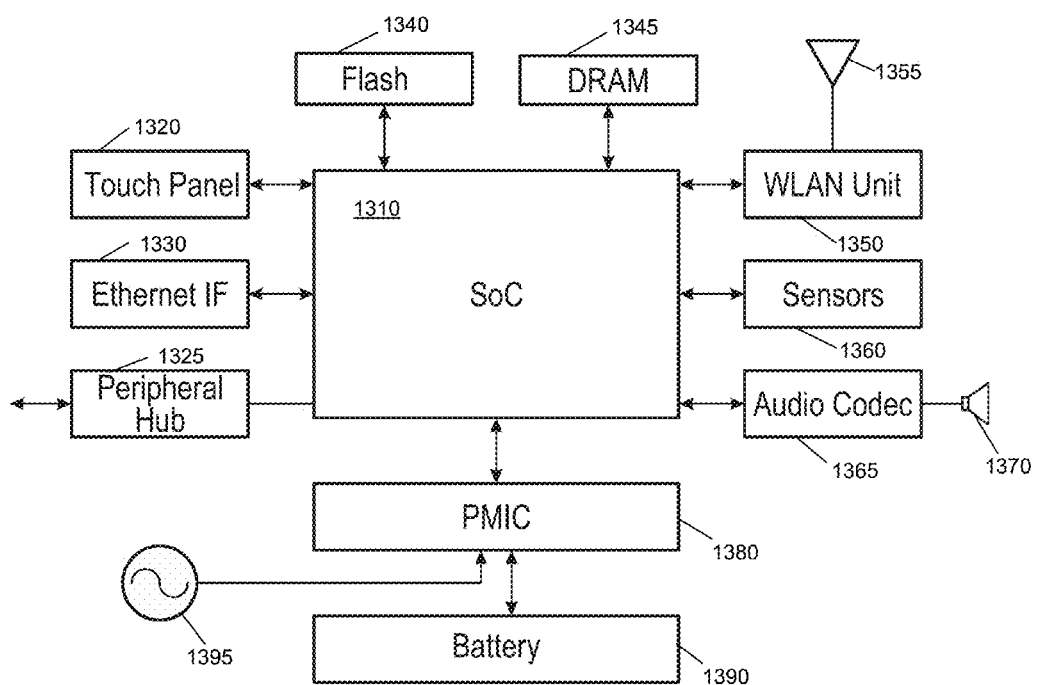
FIG. 13 is a block diagram of another example system with which one or more embodiments may be used.

Referring now to FIG. 13, shown is a block diagram of another example system with which embodiments may be used. In the illustration of FIG. 13, system 1300 may be mobile low-power system such as a tablet computer, 2:1 tablet, phablet or other convertible or standalone tablet system. As illustrated, a SoC 1310 is present and may be configured to operate as an application processor for the device.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols, including an IEEE 802.11 protocol, a Bluetooth™ protocol or any other wireless protocol.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Although not shown for ease of illustration in FIG. 13, in some embodiments, the system 1300 may include the compression accelerator 120 described above with reference to FIGS. 1A-1B. Further, in some embodiments, the system 1300 may implement some or all of the components and/or functionality described above with reference to FIGS. 1A-1D and 2A-2C.

Figure 14:
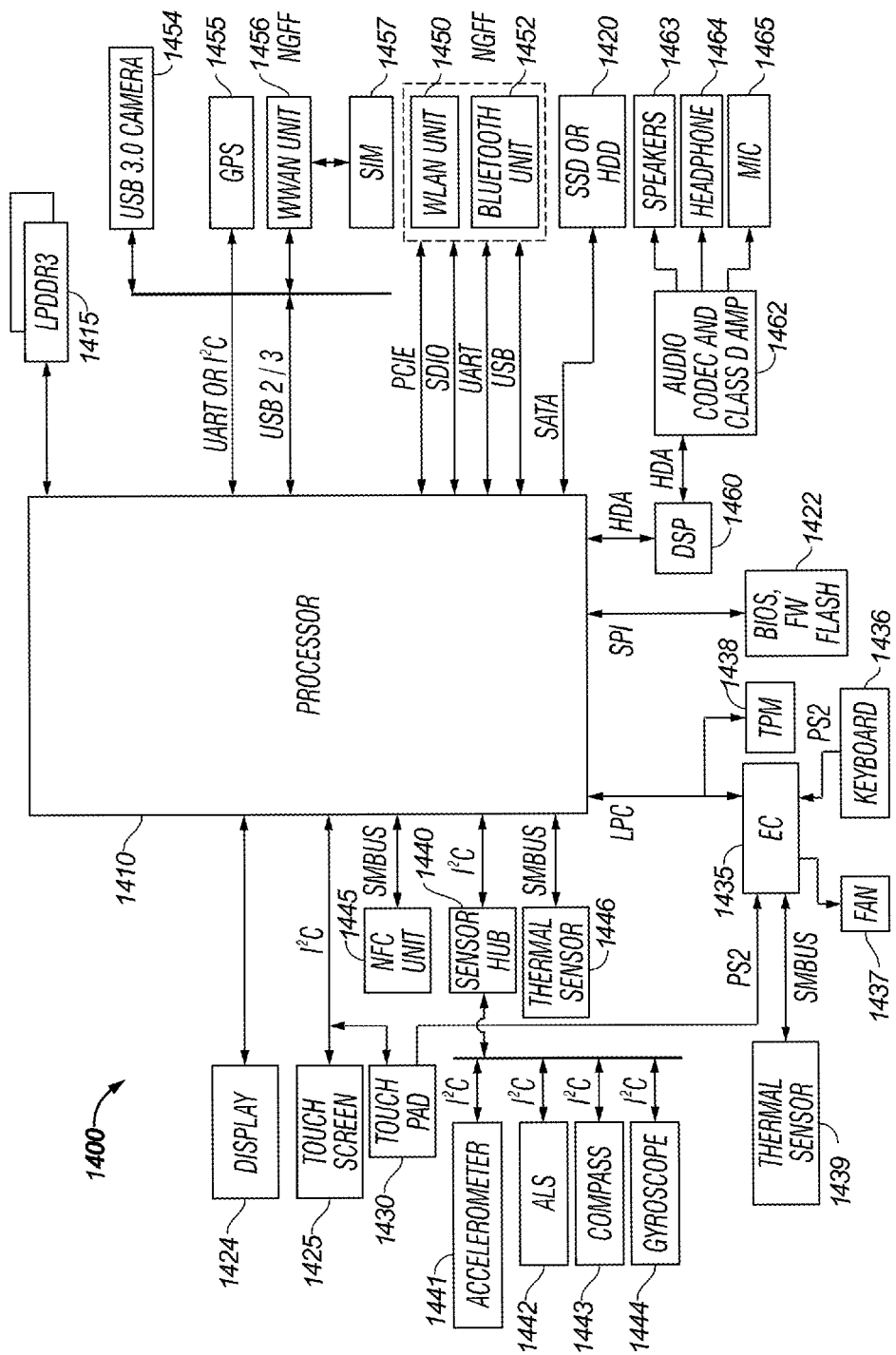
FIG. 14 is a block diagram of a computer system in accordance with one or more embodiments.

Referring now to FIG. 14, a block diagram of a representative computer system 1400 such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400. As one example, processor 1410 is implemented as a SoC.

Processor 1410, in one embodiment, communicates with a system memory 1415. As an illustrative example, the system memory 1415 is implemented via multiple memory devices or modules to provide for a given amount of system memory.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I²C interconnect. As further shown in FIG. 14, in addition to touch screen 1425, user input by way of touch can also occur via a touch pad 1430 which may be configured within the chassis and may also be coupled to the same I²C interconnect as touch screen 1425.

For perceptual computing and other purposes, various sensors may be present within the system and may be coupled to processor 1410 in different manners. Certain inertial and environmental sensors may couple to processor 1410 through a sensor hub 1440, e.g., via an I²C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

Also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 in accordance with the Trusted Computing Group (TCG) TPM Specification Version 1.2, dated Oct. 2, 2003, may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth unit 1452. Using WLAN unit 1450, Wi-Fi™ communications in accordance with a given IEEE 802.11 standard can be realized, while via Bluetooth unit 1452, short range communications via a Bluetooth protocol can occur. These units may communicate with processor 1410 via, e.g., a USB link or a universal asynchronous receiver transmitter (UART) link. Or these units may couple to processor 1410 via an interconnect according to a PCIe™ protocol or another such protocol such as a serial data input/output (SDIO) standard.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given USB protocol such as a USB 2.0 or 3.0 link, or a UART or I²C protocol.

An integrated camera module 1454 can be incorporated in the lid. To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Although not shown for ease of illustration in FIG. 14, in some embodiments, the system 1400 may include the compression accelerator 120 described above with reference to FIGS. 1A-1B. Further, in some embodiments, the system 1400 may implement some or all of the components and/or functionality described above with reference to FIGS. 1A-1D and 2A-2C.

Figure 15:
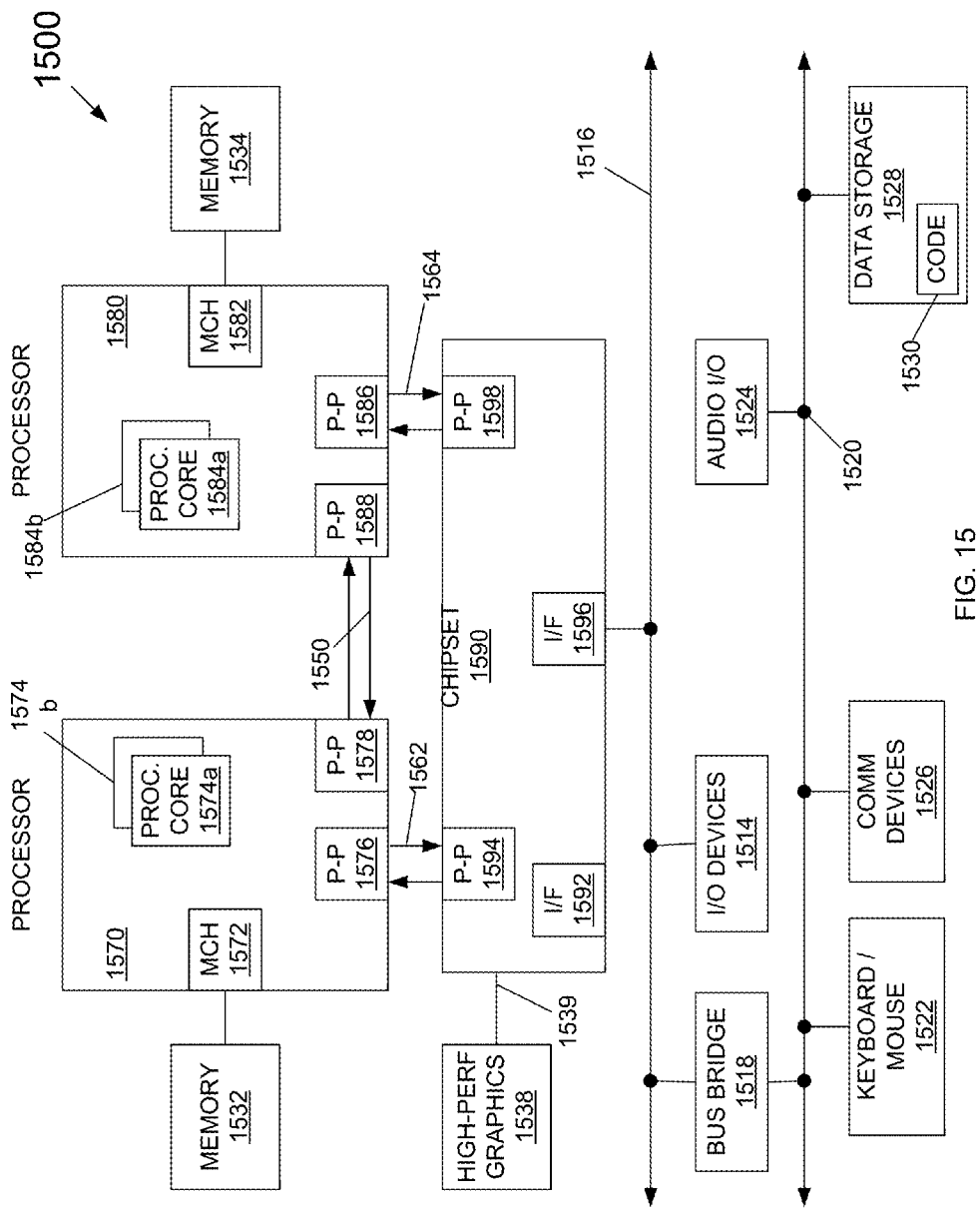
FIG. 15 is a block diagram of a system in accordance with one or more embodiments.

Embodiments may be implemented in many different system types. Referring now to FIG. 15, shown is a block diagram of a system in accordance with an embodiment of the present invention. As shown in FIG. 15, multiprocessor system 1500 is a point-to-point interconnect system, and includes a first processor 1570 and a second processor 1580 coupled via a point-to-point interconnect 1550. As shown in FIG. 15, each of processors 1570 and 1580 may be multicore processors, including first and second processor cores (i.e., processor cores 1574a and 1574b and processor cores 1584a and 1584b), although potentially many more cores may be present in the processors. Each of the processors can include a PCU or other power management logic to perform processor-based power management as described herein.

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1562 and 1564, respectively. As shown in FIG. 15, chipset 1590 includes P-P interfaces 1594 and 1598.

Furthermore, chipset 1590 includes an interface 1592 to couple chipset 1590 with a high performance graphics engine 1538, by a P-P interconnect 1539. In turn, chipset 1590 may be coupled to a first bus 1516 via an interface 1596. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

Although not shown for ease of illustration in FIG. 15, in some embodiments, the system 1500 may include the compression accelerator 120 described above with reference to FIGS. 1A-1B. Further, in some embodiments, the system 1500 may implement some or all of the components and/or functionality described above with reference to FIGS. 1A-1D and 2A-2C.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments.

In one example, a processor for performing data compression comprises: a plurality of hardware processing cores, a cache memory, and a compression accelerator comprising a hash table memory. The compression accelerator is to: determine a hash value for input data to be compressed; read a first plurality of N location values stored in a hash table entry indexed by the hash value; perform a first set of string searches in parallel from a history buffer using the first plurality of N location values stored in the hash table entry; read a second plurality of N location values stored in a first overflow table entry indexed by a first overflow pointer included in the hash table entry; and perform a second set of string searches in parallel from the history buffer using the second plurality of N location values stored in the first overflow table entry.

In an example, the first overflow table entry is one of a plurality of overflow entries included in an overflow table.

In an example, the overflow table is stored in the cache memory of the processor.

In an example, the compression accelerator is to: read a third plurality of N location values stored in a second overflow table entry indexed by a link pointer included in the first overflow table entry; and perform a third set of string searches in parallel from the history buffer using the third plurality of N location values stored in the second overflow table entry.

In an example, the compression accelerator is to: read a fourth plurality of N location values stored in a third overflow table entry indexed by a second overflow pointer included in the hash table entry; and perform a fourth set of string searches in parallel from the history buffer using the fourth plurality of N location values stored in the third overflow table entry.

In an example, the compression accelerator is to perform a duplicate string elimination operation on the input data based on at least one of the first set of string searches and the second set of string searches.

In an example, the compression accelerator comprises a plurality of comparators to perform the first and second sets of string searches in parallel.

In an example, the history buffer comprises a local history buffer and a far history buffer, where the local history buffer is included in the compression accelerator, and where the far history buffer is external to the compression accelerator.

In one example, a method for performing data compression comprises: receiving, at a compression accelerator, input data to be compressed; determining, by the compression accelerator, a hash value for the input data; determining, by the compression accelerator, whether a hash table includes a hash entry corresponding to the hash value, where the hash table is stored in the compression accelerator, where each hash entry of the hash table includes a plurality of N location fields; in response to a determination that the hash table includes the hash entry corresponding to the hash value, determining whether all N location fields in the hash entry are full; and in response to a determination that all N location fields in the hash entry are not full, storing a location value of the input data in an empty location field of the hash entry.

In an example, the method can include, in response to a determination that all N location fields in the hash entry are full: creating a new overflow entry in an overflow table; and spilling the contents of the N location fields of the hash entry to the new overflow entry. In an example, the method can include, in response to the determination that all N location fields in the hash entry are full: adding a pointer to the new overflow entry to an overflow pointer field of the hash entry; and storing the location value of the input data in a location field of the hash entry. In an example, the overflow table is stored in a cache memory external to the compression accelerator.

In an example, the method can include, in response to a determination that the hash table does not include a hash entry corresponding to the hash value: adding a new hash entry to the hash table; and storing the location value of the input data in a location field of the new hash entry.

In an example, the method can include, in response to the determination that the hash table includes the hash entry corresponding to the hash value: reading at least one location value from the hash entry; and performing a duplicate string elimination operation using the at least one location value read from the hash entry.

In one example, a machine readable medium has stored thereon data, which if used by at least one machine, causes the at least one machine to fabricate at least one integrated circuit to perform the method as described above.

In an example, an apparatus for processing instructions can be configured to perform the method as described above.

In an example, a system for performing data compression includes a processor comprising a compression accelerator, and an external memory coupled to the processor. The compression accelerator can comprise: a hash table memory, where the hash table memory is dedicated to store a hash table including a plurality of hash entries, where each hash entry of the hash table includes a first plurality of N location fields and an overflow pointer field; and a plurality of comparators to, in response to an input string, perform a first set of N comparisons in parallel using the first plurality of N location fields in a first hash entry, where the first hash entry is indexed to a hash value generated using the input string.

In an example, each of the first plurality of N location fields is to store a location value for a unique location in a history buffer.

In an example, the history buffer comprises a local history buffer and a far history buffer, where the compression accelerator includes a local history memory to store the local history buffer.

In an example, the far history buffer is stored in a cache memory external to the compression accelerator.

In an example, the overflow pointer field is to store a pointer to a first overflow entry of an overflow table.

In an example, the first overflow entry of the overflow table includes a second plurality of N location fields and a link pointer field, where the link pointer field is to store a pointer to a second overflow entry of the overflow table. In an example, the plurality of comparators are further to perform a second set of N comparisons in parallel using the second plurality of N location fields in the first overflow entry.

In an example, the overflow table is stored in a cache memory external to the compression accelerator.

In one example, a machine-readable medium has stored thereon data, which if used by at least one machine, causes the at least one machine to fabricate at least one integrated circuit to perform a method. The method can include: receiving, at a compression accelerator, input data to be compressed; determining, by the compression accelerator, a hash value for the input data; determining, by the compression accelerator, whether a hash table includes a hash entry corresponding to the hash value, where the hash table is stored in the compression accelerator, where each hash entry of the hash table includes a plurality of N location fields; in response to a determination that the hash table includes the hash entry corresponding to the hash value, determining whether all N location fields in the hash entry are full; and in response to a determination that all N location fields in the hash entry are not full, storing a location value of the input data in an empty location field of the hash entry.

In an example, the method can include, in response to a determination that all N location fields in the hash entry are full: creating a new overflow entry in an overflow table; and spilling the contents of the N location fields of the hash entry to the new overflow entry.

In an example, the method can include, in response to the determination that all N location fields in the hash entry are full: adding a pointer to the new overflow entry to an overflow pointer field of the hash entry; and storing the location value of the input data in a location field of the hash entry.

In an example, the overflow table is stored in a cache memory external to the compression accelerator.

In an example, the method can include, in response to a determination that the hash table does not include a hash entry corresponding to the hash value: adding a new hash entry to the hash table; and storing the location value of the input data in a location field of the new hash entry.

In an example, the method can include, in response to the determination that the hash table includes the hash entry corresponding to the hash value: reading at least one location value from the hash entry; and performing a duplicate string elimination operation using the at least one location value read from the hash entry.

Understand that various combinations of the above examples are possible.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
a plurality of hardware processing cores;
a cache memory; and
a compression accelerator comprising a hash table memory, the compression accelerator to:
determine a hash value for input data to be compressed;
read a first plurality of N location values stored in a hash table entry indexed by the hash value;
perform a first set of string searches in parallel from a history buffer using the first plurality of N location values stored in the hash table entry;

read a second plurality of N location values stored in a first overflow table entry indexed by a first overflow pointer included in the hash table entry; and perform a second set of string searches in parallel from the history buffer using the second plurality of N location values stored in the first overflow table entry.

2. The processor of claim 1, wherein the first overflow table entry is one of a plurality of overflow entries included in an overflow table.

3. The processor of claim 2, wherein the overflow table is stored in the cache memory of the processor.

4. The processor of claim 1, wherein the compression accelerator is to:

read a third plurality of N location values stored in a second overflow table entry indexed by a link pointer included in the first overflow table entry; and perform a third set of string searches in parallel from the history buffer using the third plurality of N location values stored in the second overflow table entry.

5. The processor of claim 1, wherein the compression accelerator is to:

read a fourth plurality of N location values stored in a third overflow table entry indexed by a second overflow pointer included in the hash table entry; and perform a fourth set of string searches in parallel from the history buffer using the fourth plurality of N location values stored in the third overflow table entry.

6. The processor of claim 1, wherein the compression accelerator is to:

perform a duplicate string elimination operation on the input data based on at least one of the first set of string searches and the second set of string searches.

7. The processor of claim 1, wherein the compression accelerator comprises a plurality of comparators to perform the first and second sets of string searches in parallel.

8. The processor of claim 1, wherein the history buffer comprises a local history buffer and a far history buffer, wherein the local history buffer is included in the compression accelerator, and wherein the far history buffer is external to the compression accelerator.

9. A machine-readable medium having stored thereon data, which if used by at least one machine, causes the at least one machine to fabricate at least one integrated circuit to perform a method comprising:

receiving, at a compression accelerator, input data to be compressed;

determining, by the compression accelerator, a hash value for the input data;

determining, by the compression accelerator, whether a hash table includes a hash entry corresponding to the hash value, wherein the hash table is stored in the compression accelerator, wherein each hash entry of the hash table includes a plurality of N location fields;

in response to a determination that the hash table includes the hash entry corresponding to the hash value, determining whether all N location fields in the hash entry are full; and in response to a determination that all N location fields in the hash entry are not full, storing a location value of the input data in an empty location field of the hash entry.

10. The machine-readable medium of claim 9, wherein the method further comprises, in response to a determination that all N location fields in the hash entry are full:

creating a new overflow entry in an overflow table; and spilling the contents of the N location fields of the hash entry to the new overflow entry.

11. The machine-readable medium of claim 10, wherein the method further comprises, in response to the determination that all N location fields in the hash entry are full:

adding a pointer to the new overflow entry to an overflow pointer field of the hash entry; and storing the location value of the input data in a location field of the hash entry.

12. The machine-readable medium of claim 10, wherein the overflow table is stored in a cache memory external to the compression accelerator.

13. The machine-readable medium of claim 9, wherein the method further comprises, in response to a determination that the hash table does not include a hash entry corresponding to the hash value:

adding a new hash entry to the hash table; and storing the location value of the input data in a location field of the new hash entry.

14. The machine-readable medium of claim 9, wherein the method further comprises, in response to the determination that the hash table includes the hash entry corresponding to the hash value:

reading at least one location value from the hash entry; and performing a duplicate string elimination operation using the at least one location value read from the hash entry.

15. A system comprising:

a processor comprising a compression accelerator, the compression accelerator comprising:

a hash table memory, wherein the hash table memory is dedicated to store a hash table including a plurality of hash entries, wherein each hash entry of the hash table includes a first plurality of N location fields and an overflow pointer field; and a plurality of comparators to, in response to an input string, perform a first set of N comparisons in parallel using the first plurality of N location fields in a first hash entry, wherein the first hash entry is indexed to a hash value generated using the input string; and an external memory coupled to the processor.

16. The system of claim 15, wherein each of the first plurality of N location fields is to store a location value for a unique location in a history buffer.

17. The system of claim 16, wherein the history buffer comprises a local history buffer and a far history buffer, wherein the compression accelerator includes a local history memory to store the local history buffer.

18. The system of claim 15, wherein the overflow pointer field is to store a pointer to a first overflow entry of an overflow table.

19. The system of claim 18, wherein the first overflow entry of the overflow table includes a second plurality of N location fields and a link pointer field, wherein the link pointer field is to store a pointer to a second overflow entry of the overflow table.

20. The system of claim 19, wherein the plurality of comparators are further to perform a second set of N comparisons in parallel using the second plurality of N location fields in the first overflow entry.

* * * * *